United States Patent [19]
Black

[11] Patent Number: 4,749,943
[45] Date of Patent: Jun. 7, 1988

[54] AUTOMATIC TEST SYSTEM

[76] Inventor: Thomas Black, 38 Maureen Dr., Smithfield, R.I. 02917

[21] Appl. No.: 808,042

[22] Filed: Dec. 12, 1985

Related U.S. Application Data

[63] Continuation-in-part of Ser. No. 619,051, Jun. 11, 1984.

[51] Int. Cl.[4] ............... G01R 1/04; G01R 1/073
[52] U.S. Cl. ............... 324/158 F; 324/158 P; 29/739
[58] Field of Search ............ 324/158 R, 158 F, 158 P, 324/73 R, 73 PC; 29/705, 837, 845, 729, 739

[56] References Cited

U.S. PATENT DOCUMENTS

| | | | |
|---|---|---|---|
| 4,333,233 | 6/1982 | Dodson et al. | 29/845 |
| 4,357,062 | 11/1982 | Everett | 324/158 F |
| 4,405,191 | 9/1983 | Fettig | 324/158 F |
| 4,535,536 | 8/1985 | Wyss | 324/73 PC |
| 4,538,351 | 9/1985 | Rapp | 29/739 |

FOREIGN PATENT DOCUMENTS

| | | | |
|---|---|---|---|
| 3312436 | 5/1984 | Fed. Rep. of Germany . | |
| 2302798 | 10/1976 | France | 29/739 |

Primary Examiner—Reinhard J. Eisenzopf
Assistant Examiner—W. Burns
Attorney, Agent, or Firm—Wolf, Greenfield & Sacks

[57] ABSTRACT

An automatic test apparatus for circuit boards in which the system is divided into an assembly sub-system, and a control sub-system. Probes are transferred from a magazine to a test head that is comprised of a base plate and probe plate along with associated support tables that enable X and Y translation of the probe plate to accommodate random pattern test points. The assembled test head is conveyed to a test station wherein a pressure plate contacts the circuit board being tested which in turn contacts the test head to carry out testing. The control sub-system covers control of all aspects of probe transfer including control of ejector members for probe transfer.

34 Claims, 27 Drawing Sheets

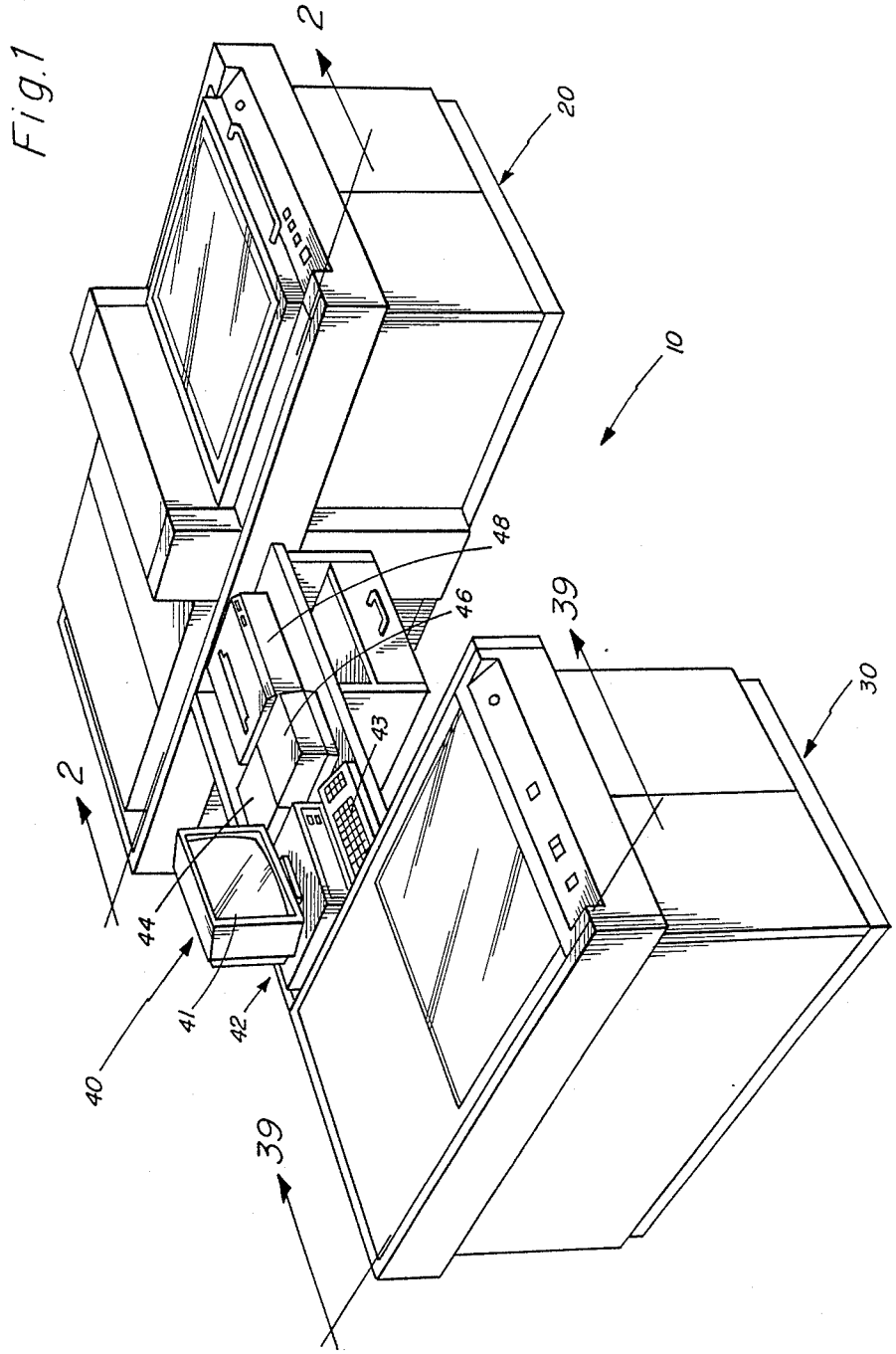

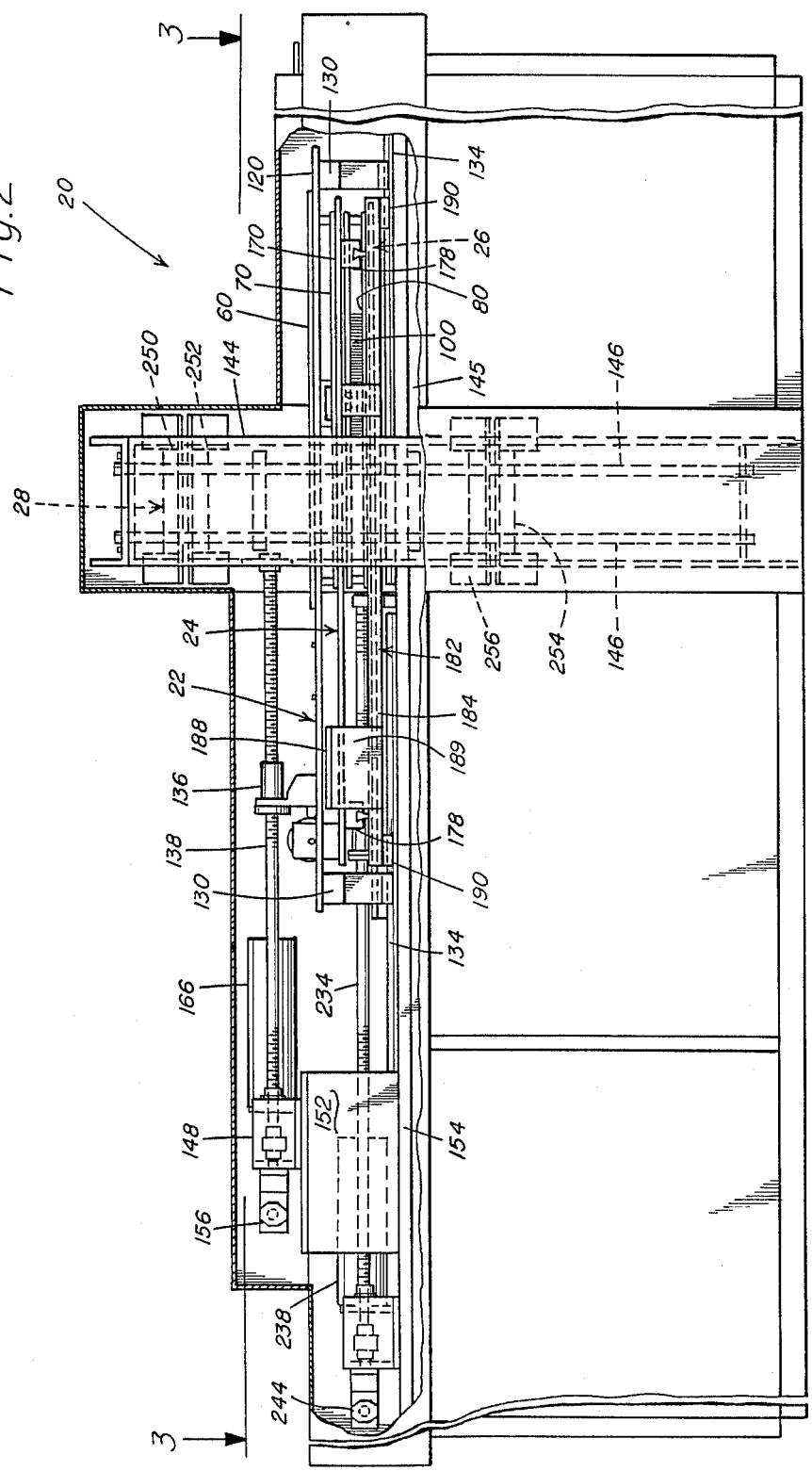

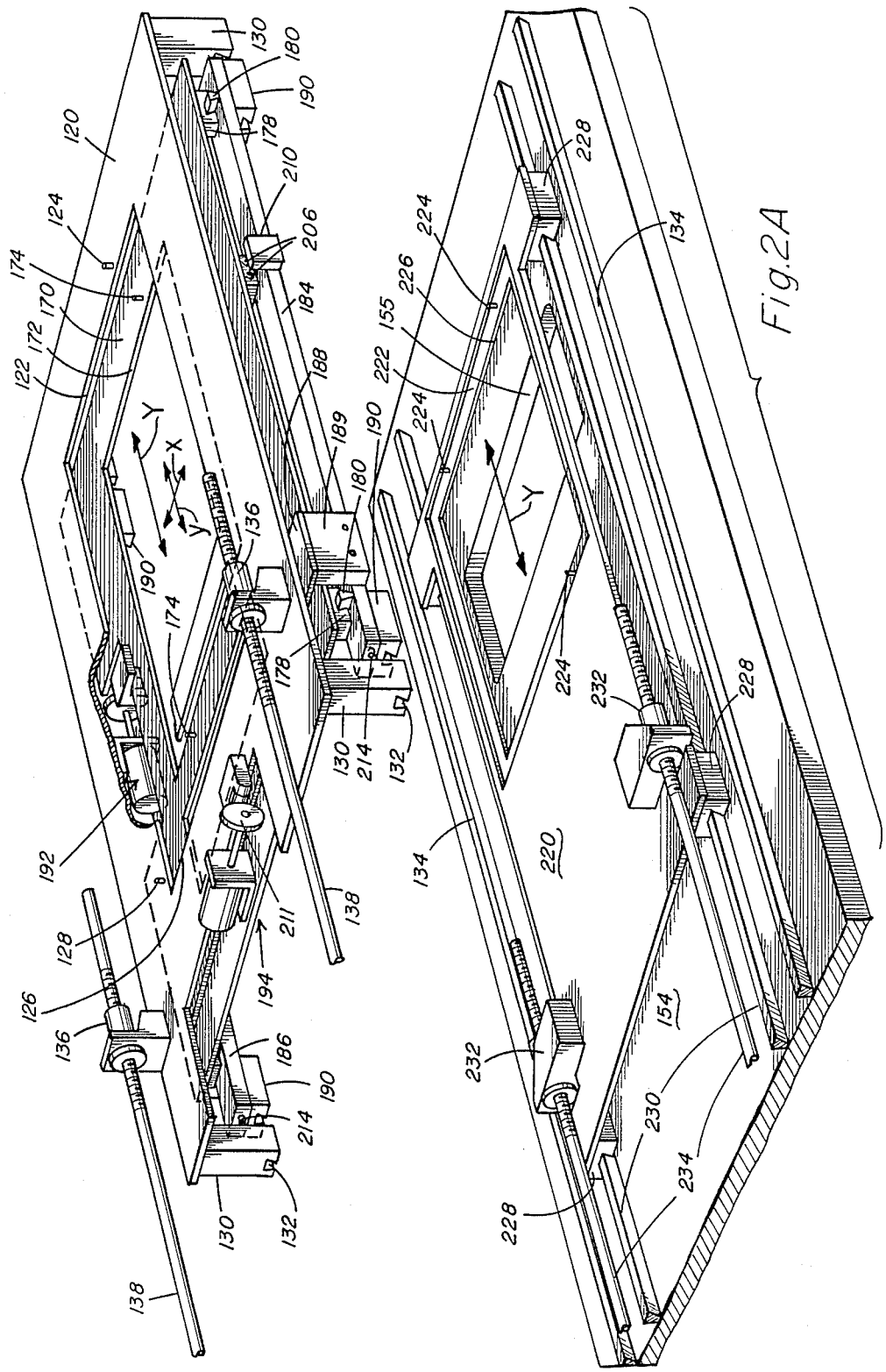

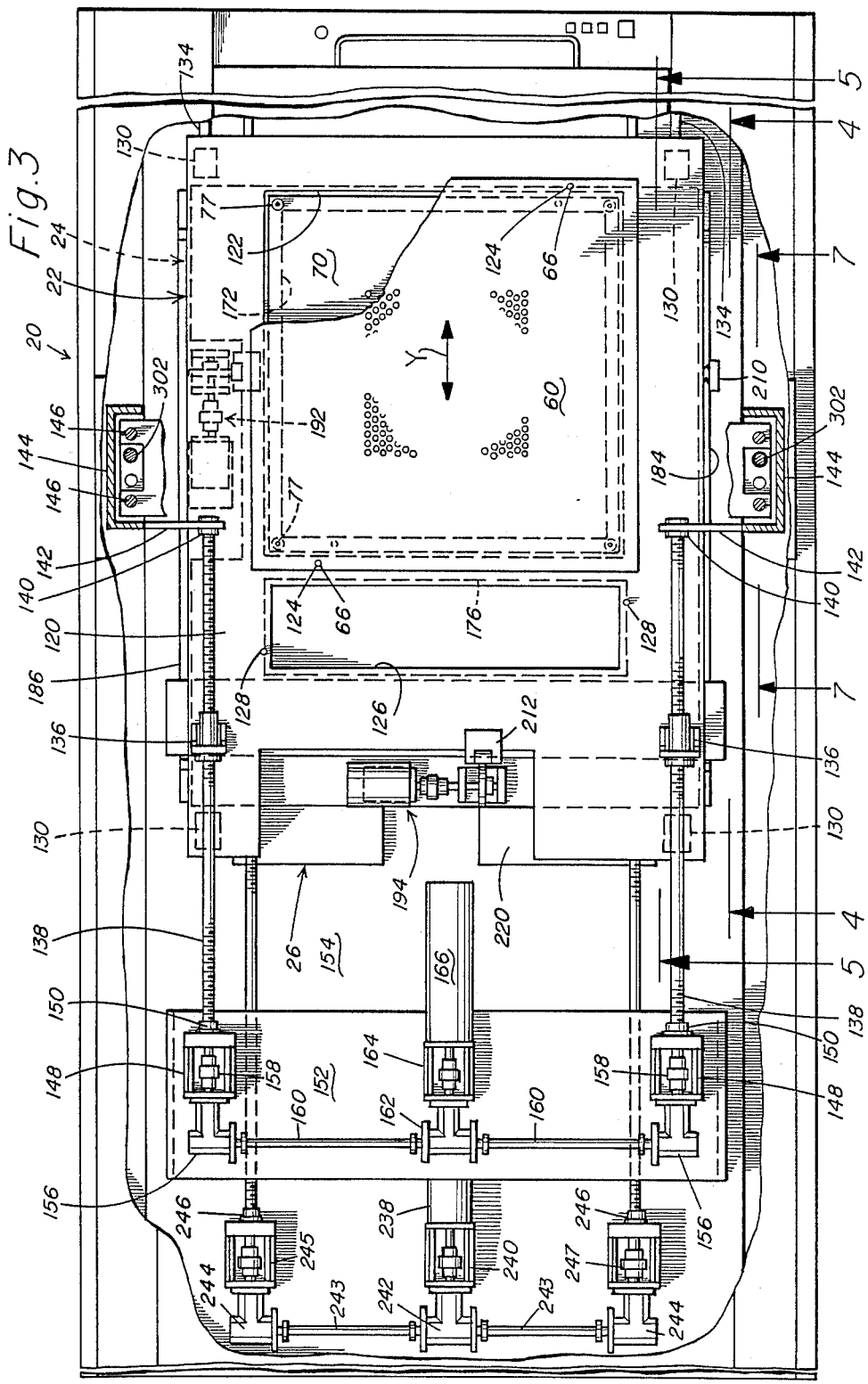

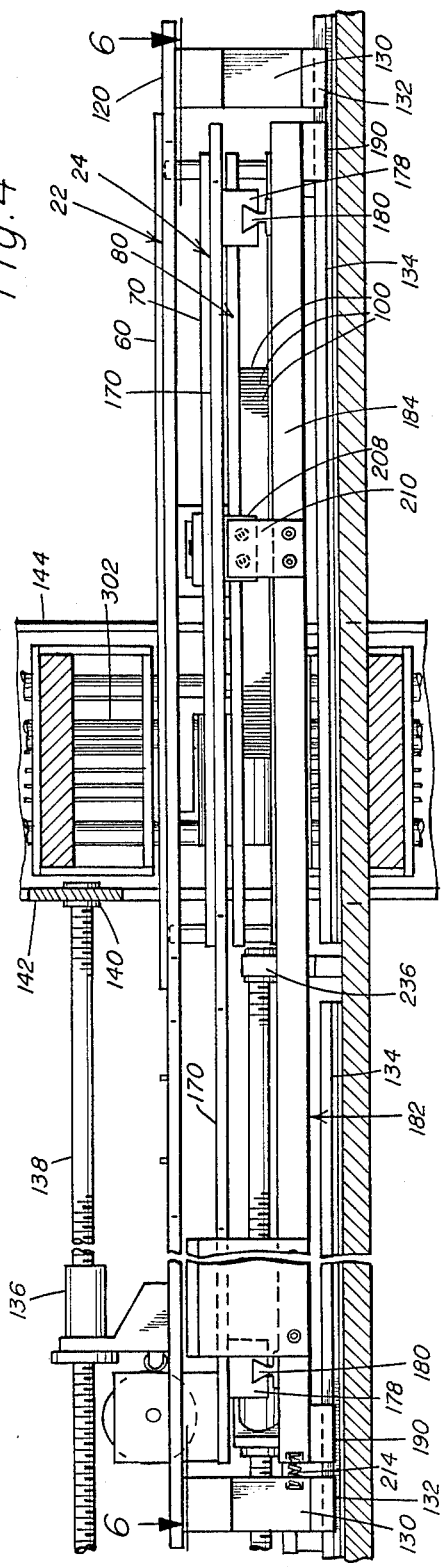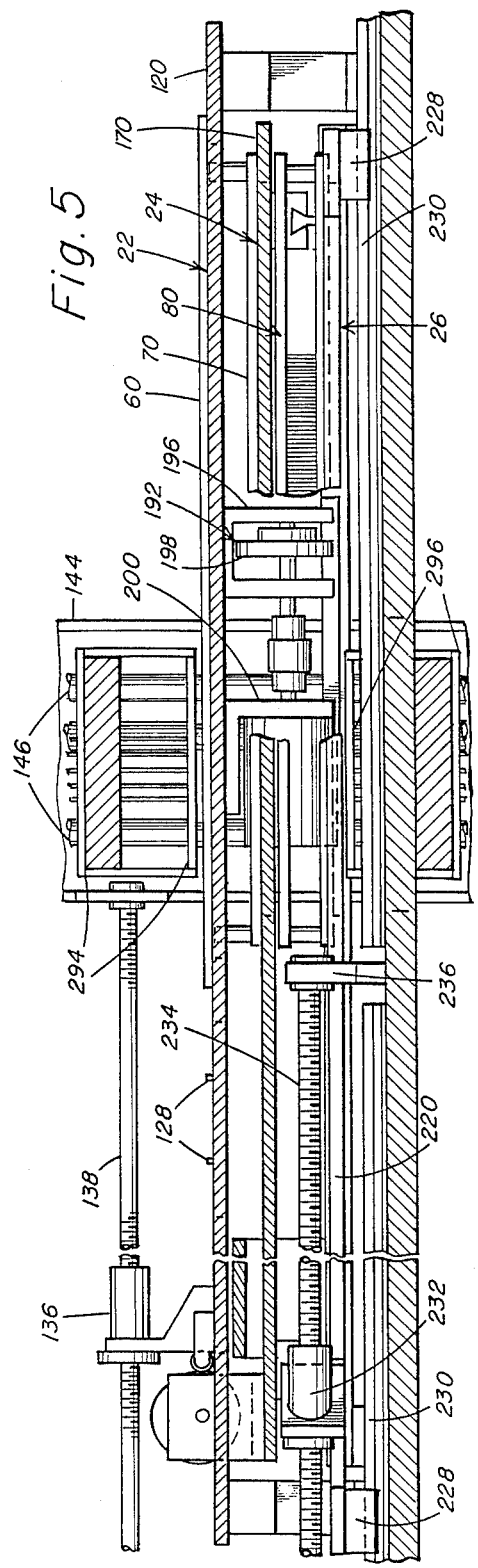

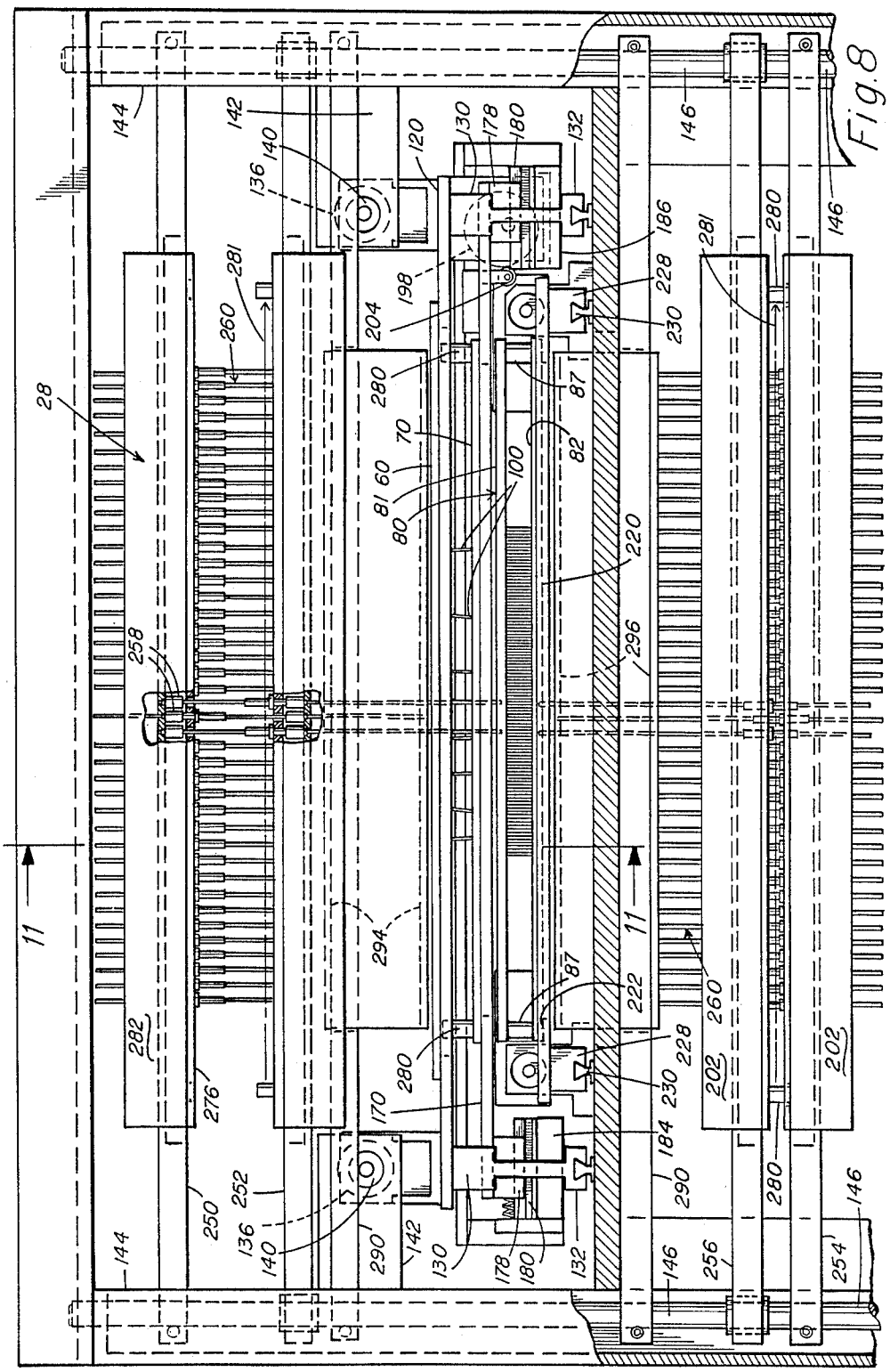

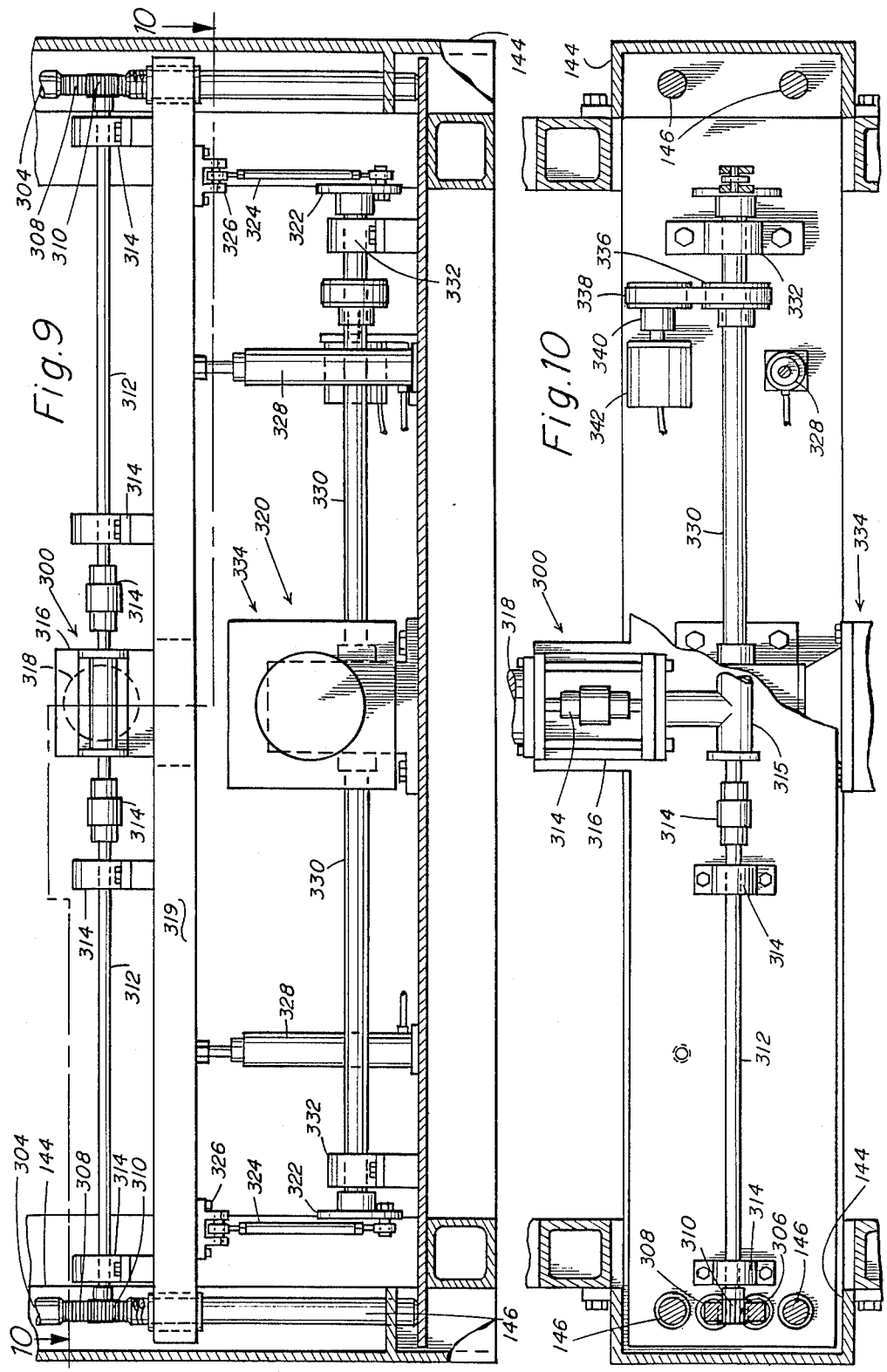

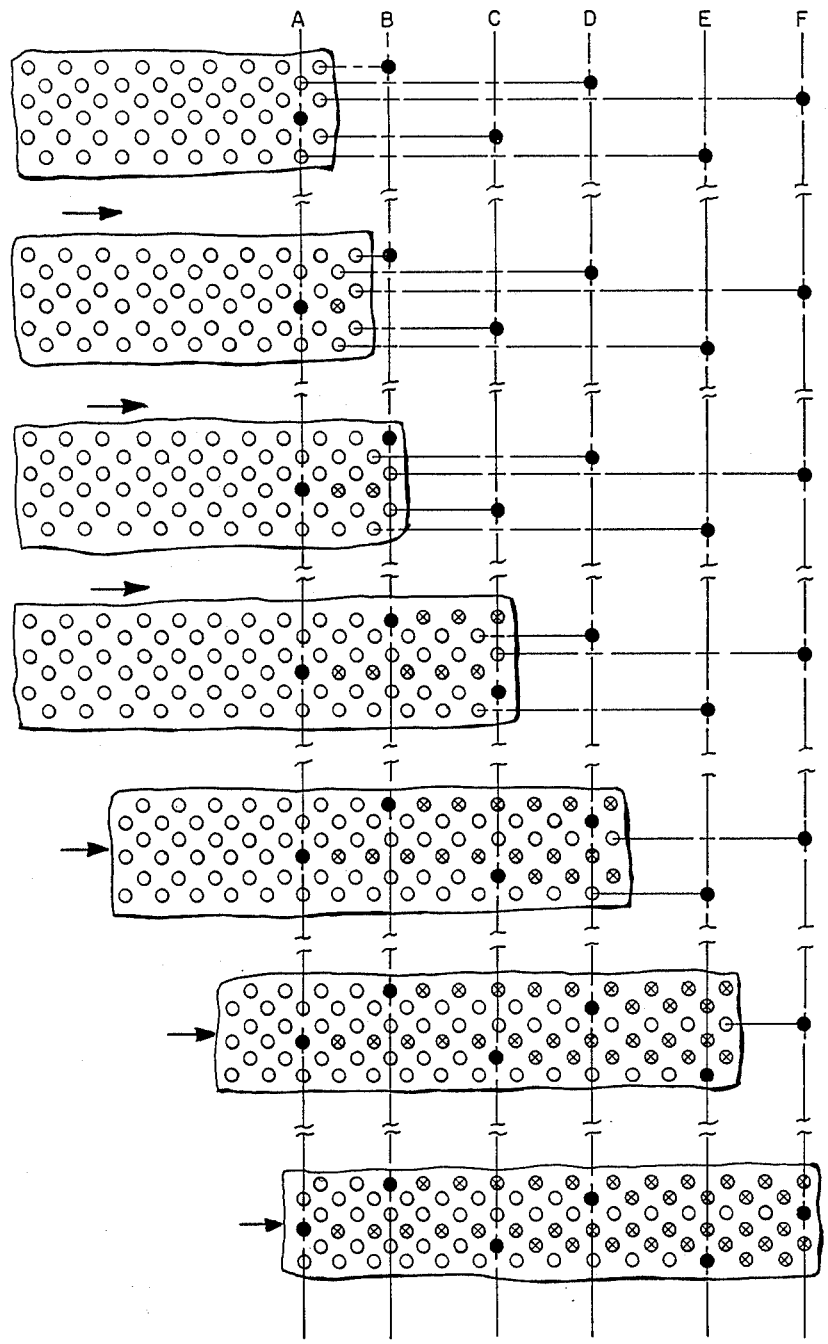

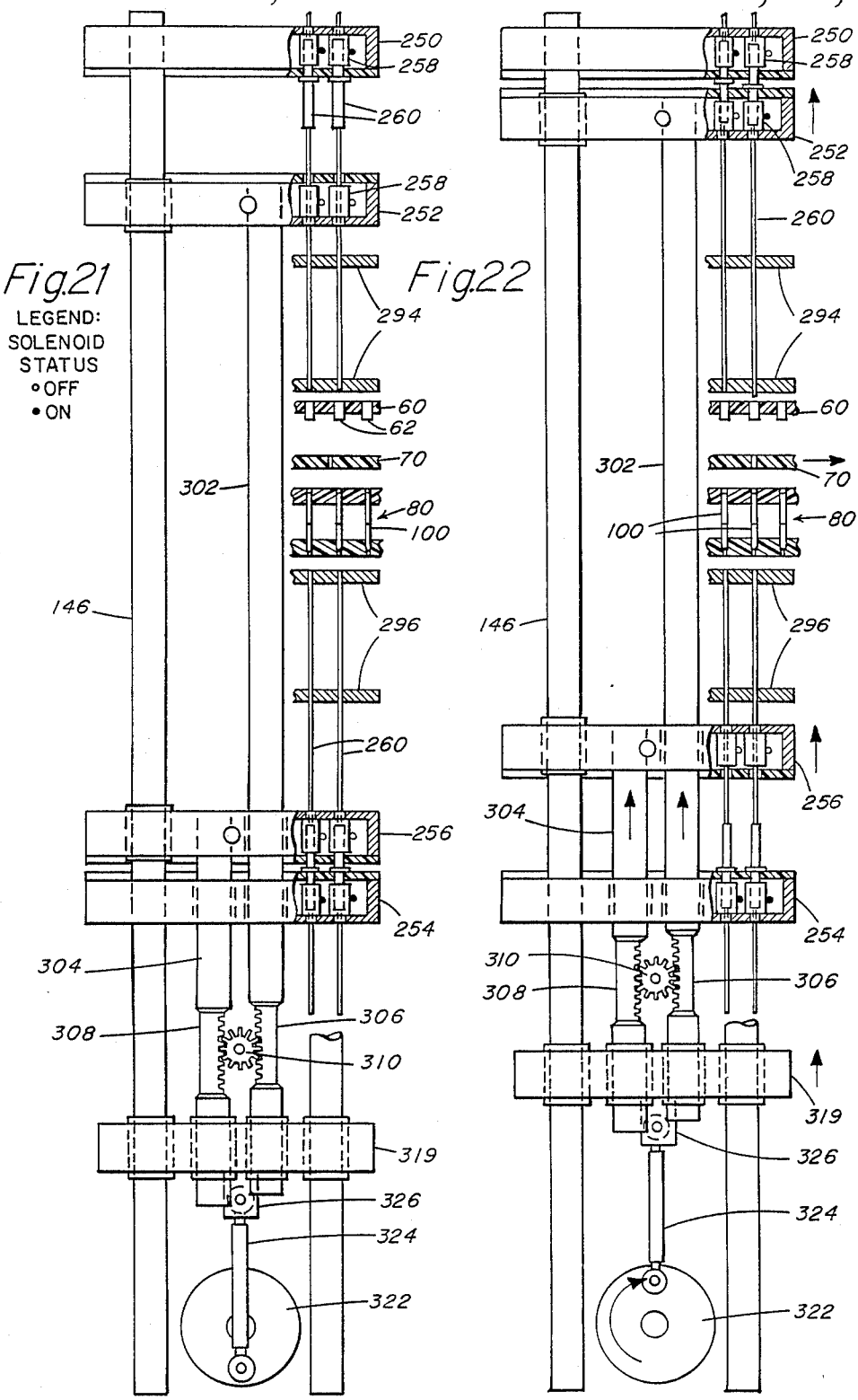

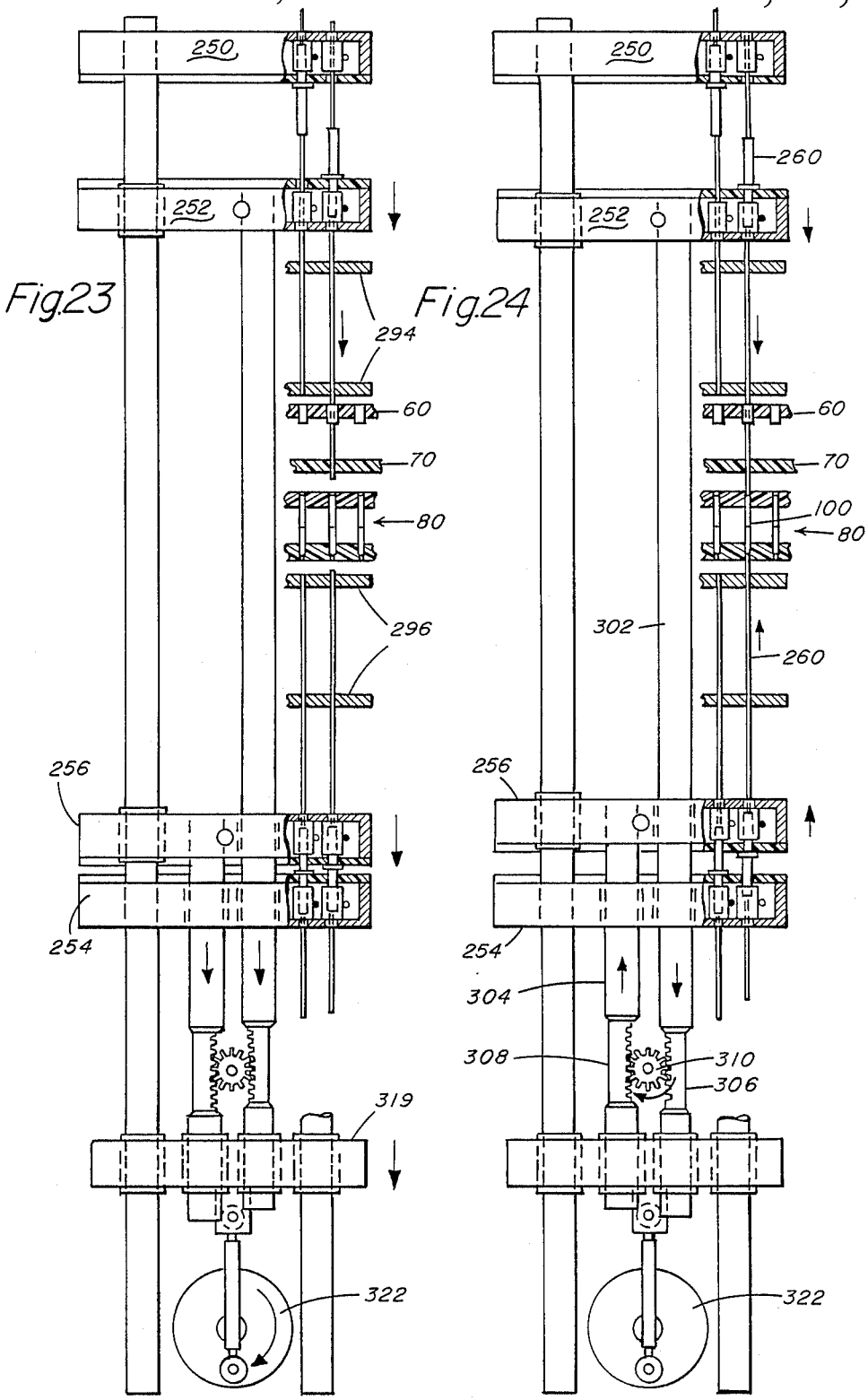

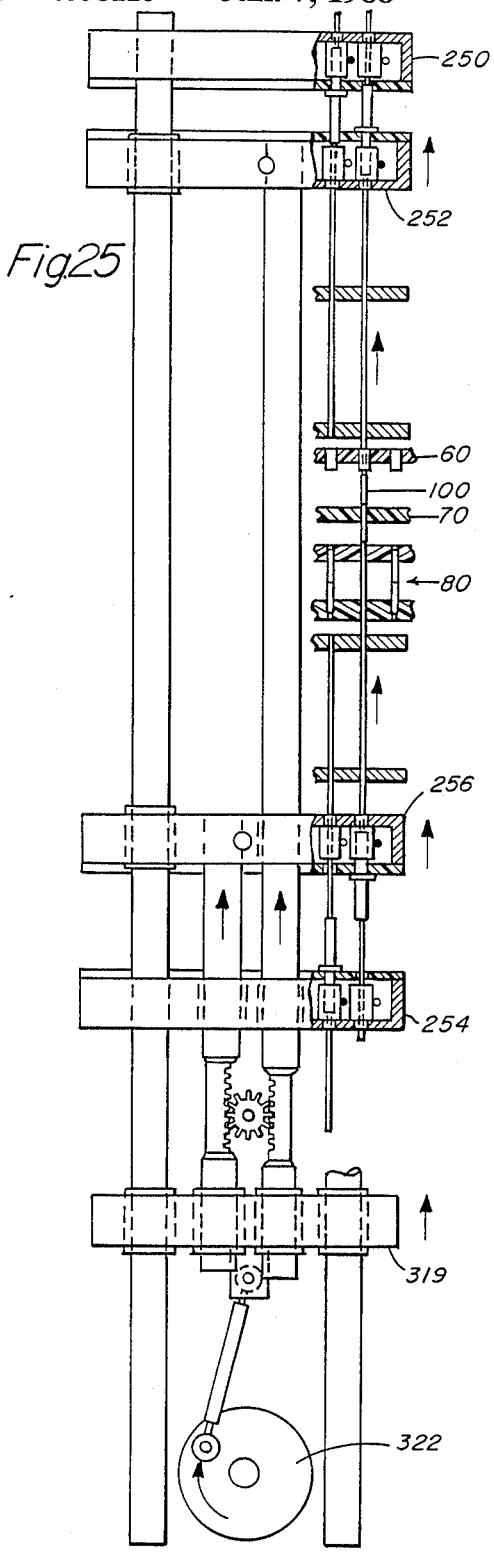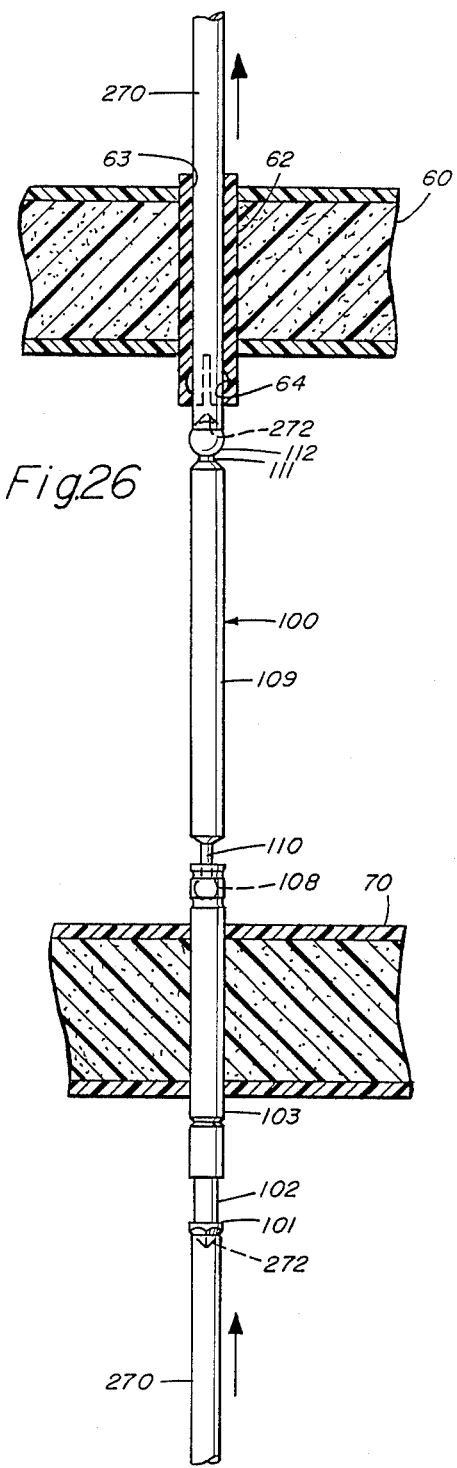

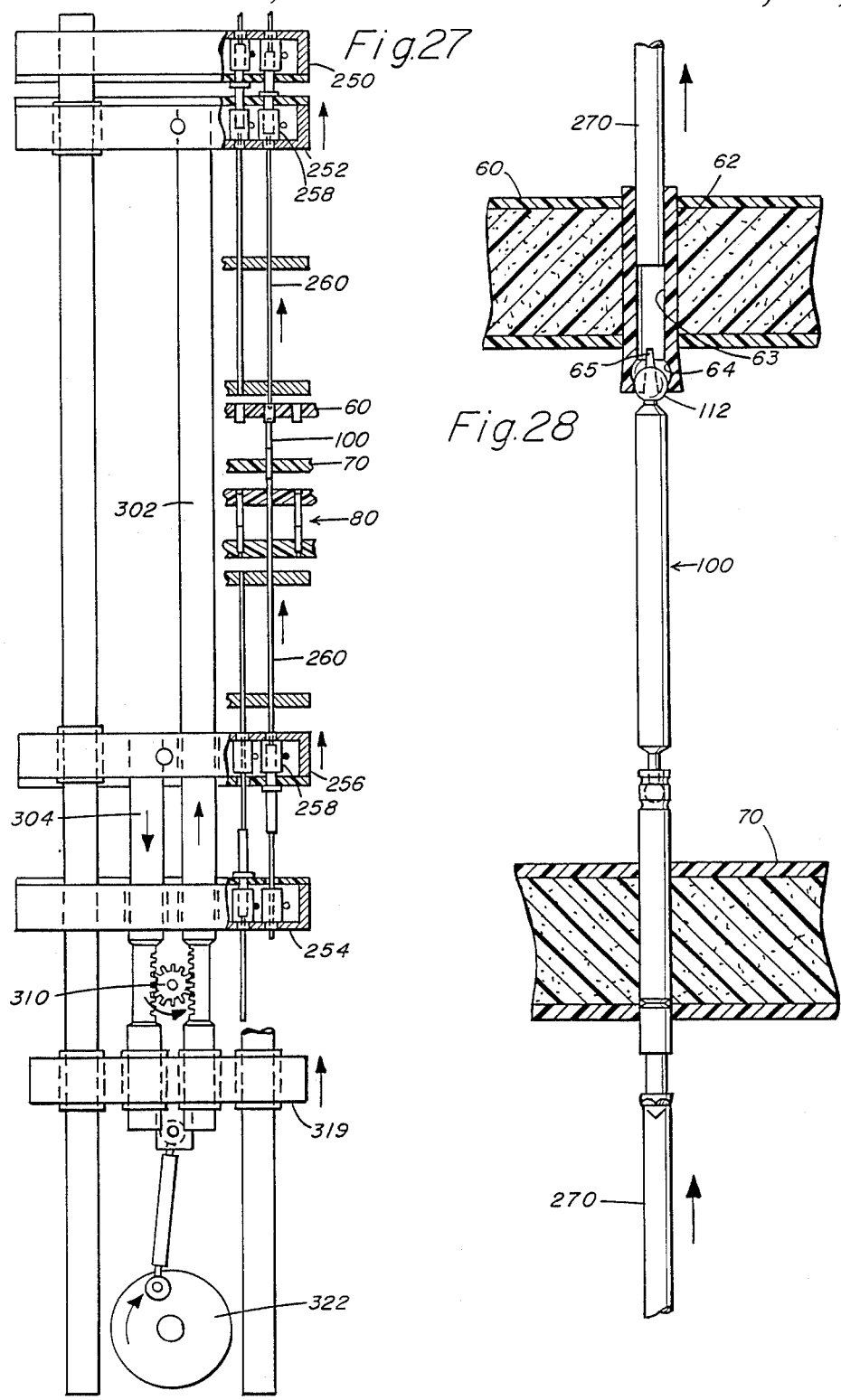

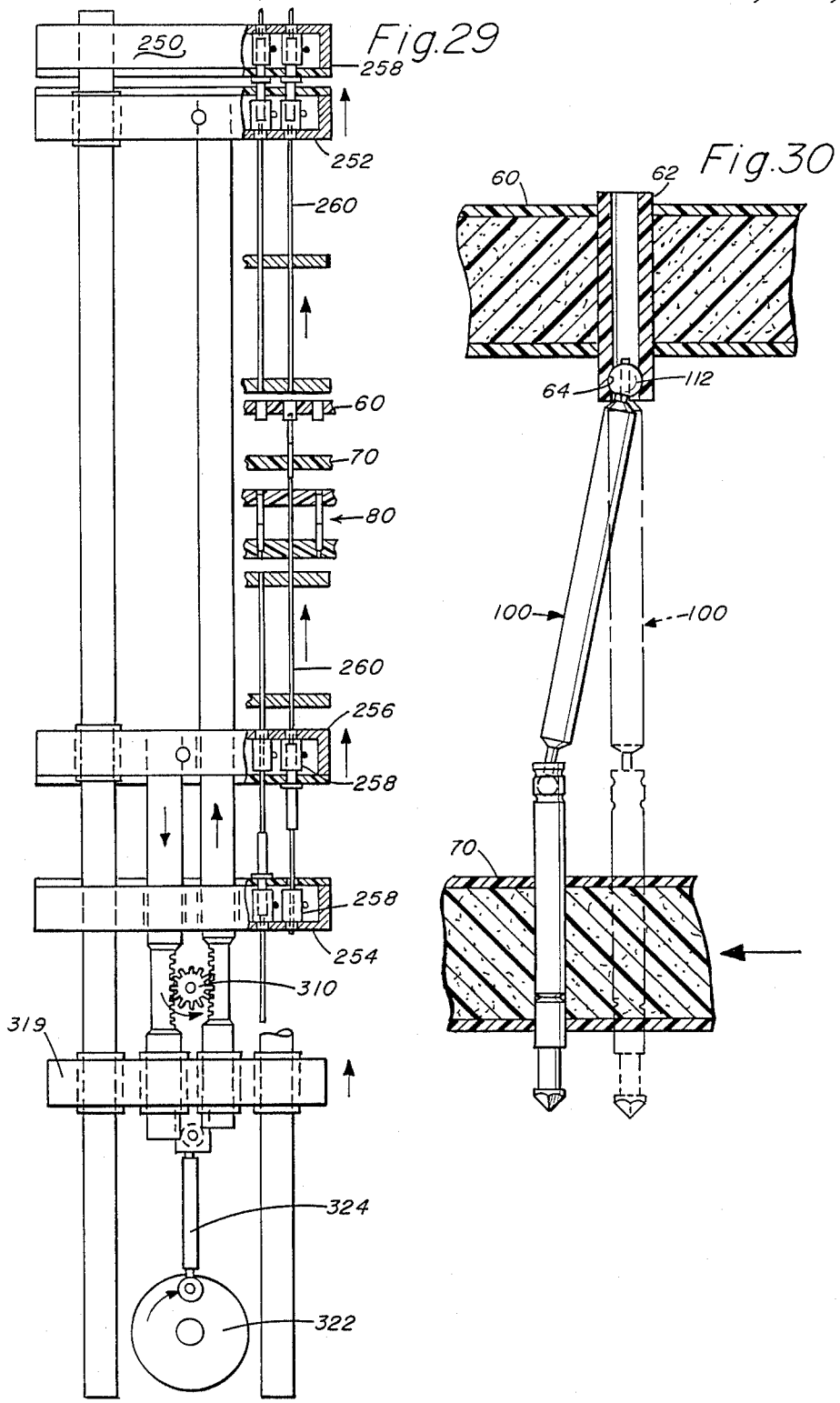

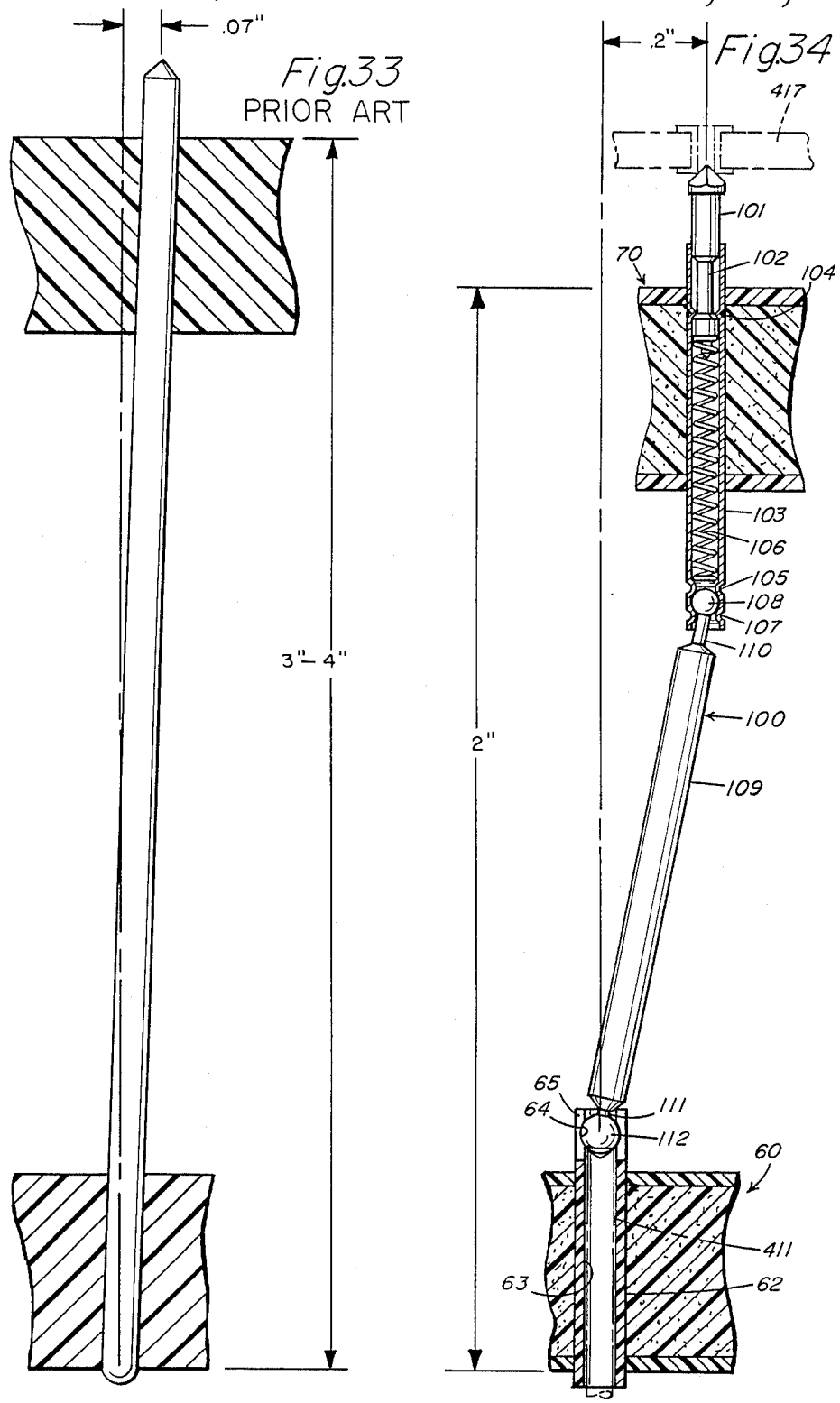

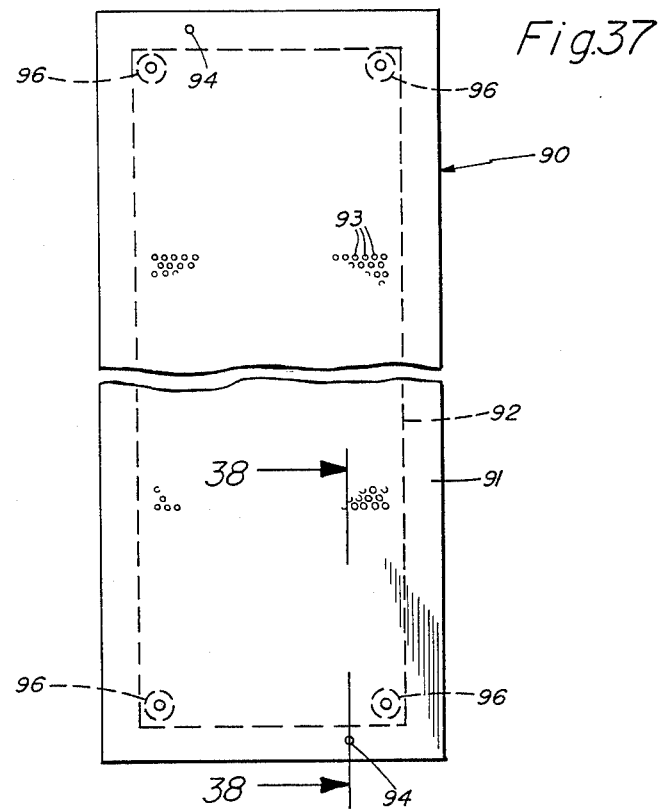
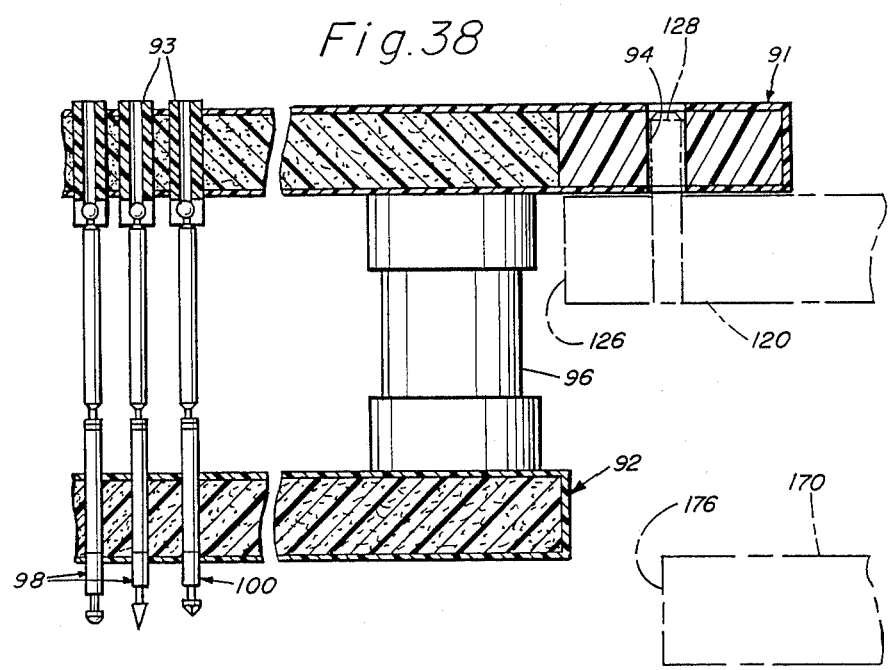

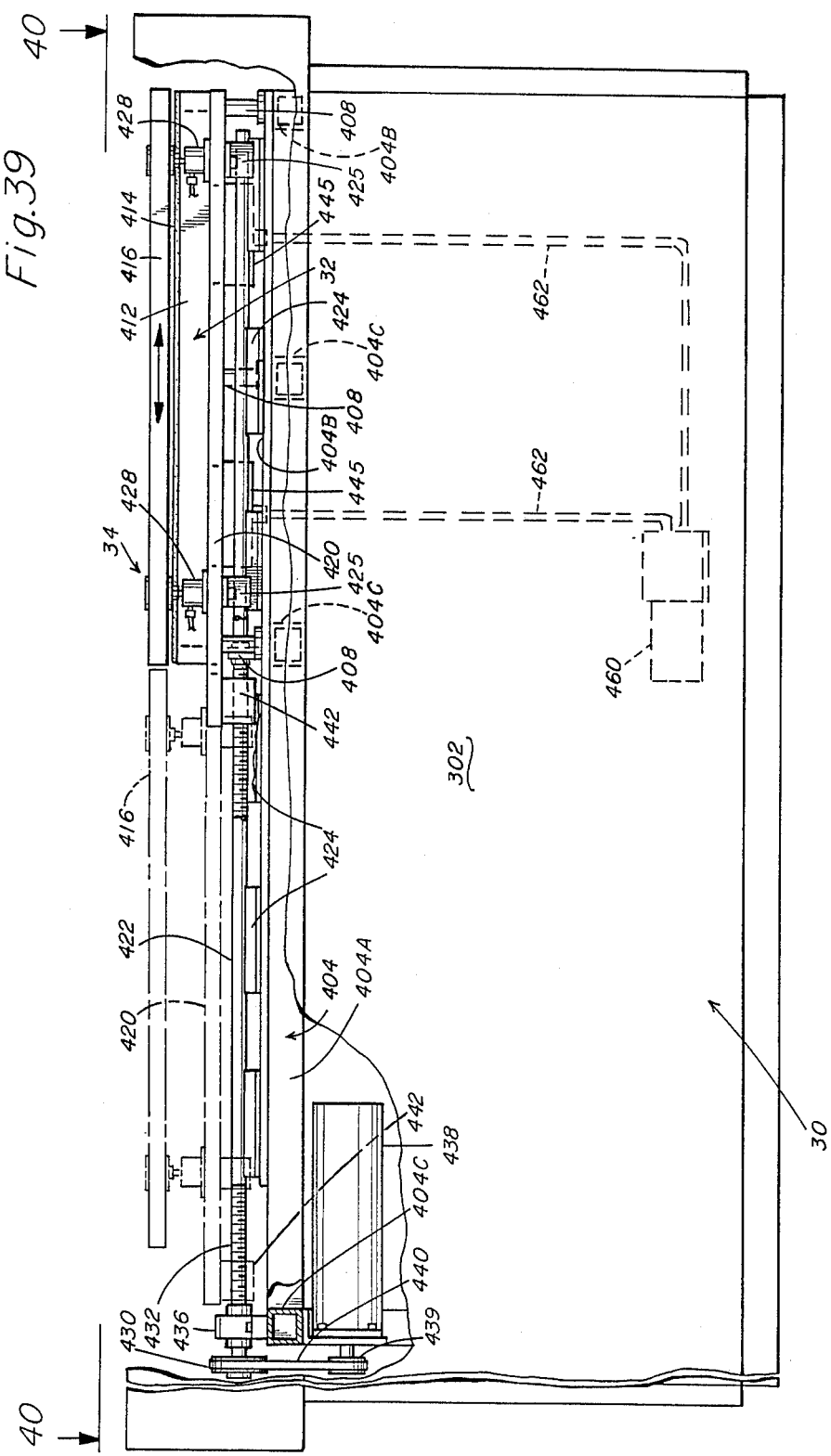

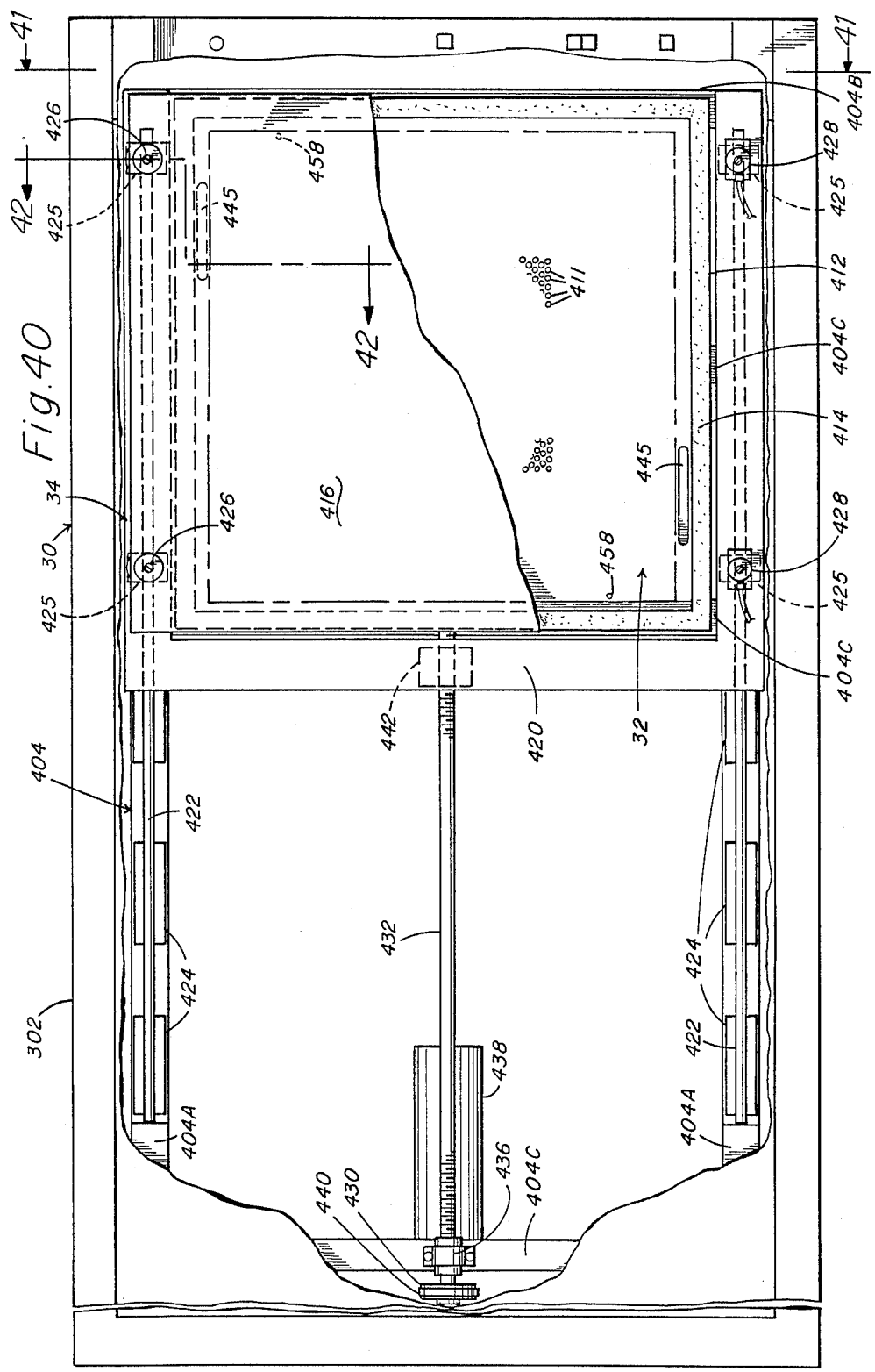

AUTOMATIC TEST SYSTEM

RELATED APPLICATION

This is a continuation-in-part of application Ser. No. 619,051 filed June 11, 1984 and also relating to an automatic test system.

BACKGROUND OF THE INVENTION

The present invention relates in general to an automatic test system or apparatus and pertains, more particularly, to a test system that incorporates a plurality of sub-systems including an assembly sub-system, a fixturing or test sub-system, and a control sub-system.

It is common practice in the electronics industry to subject printed circuit boards and their assemblies to various types of electrical tests to ensure quality and reliability. These tests include both the continuity testing of bare (unloaded) boards to detect unwanted open circuits and short circuits, and loaded board testing of completed printed circuit board assemblies to ensure the correct functioning of electronic components loaded on the board. In either case, testing is accomplished by means of automatic test equipment (ATE) which generally comprises means for applying suitable electrical stimuli (inputs) to appropriate test points on the printed circuit board and for measuring the resulting signals (outputs) from other selected test points. In particular, electrical connections between the selected test points on the printed circuit board and the input/output terminals of the ATE system are accomplished by means of ATE fixtures or fixturing systems.

Typically, an ATE fixture incorporates a 'bed of nails' comprising a parallel array of spring-loaded test probes carried in probe receptacles which are secured in a probe plate in a geometrical pattern precisely matching, in distribution and number, the selected test point sites on the printed circuit board. The lower extremities of the probe receptacles are wired individually to a suitable interface connector by which means electrical connection is made between the individual probes and the input/output terminals of the appropriate ATE system. Printed circuit boards to be tested are inserted individually in the fixture with the test points carefully aligned with the test probe array. The printed circuit board is then forced against the test probe array by mechanical, hydraulic, pneumatic or vacuum-operated means so that the spring-loaded probes are compressed and suitable electrical connection is made between each test point and the head of the corresponding probe, which typically incorporates a sharpened tip or multiple points to penetrate the solder run at the test point location. Transmission of stimuli and resultant signals between the ATE system and the printed circuit board under test is thus made possible by the fixture.

Because of the generally unique nature of the test-point pattern on a given printed circuit board type, a new and different fixture is usually required for each and every different printed circuit board type tested. Since a typical user of ATE equipment may have to test many types of circuit boards each year, conventional fixtures of the type described above have three serious disadvantages, namely:

(1) Cost—a typical fixture can cost from several thousand to several tens of thousands of dollars and has little or no scrap value once testing of its printed circuit board type is completed;

(2) Time to Fabricate—typical delivery times range from 2 to 6 weeks which can often result in delay of production schedules;

(3) Storage Requirements—the typical conventional fixture is not bulky and requires considerable storage space when not in use;

(4) Handling Requirements—the bulk and weight of the typical fixture poses significant handling problems for test personnel.

The foregoing problems associated with conventional fixturing have long been recognized in the industry and have spurred efforts to develop a universal fixturing system that would accommodate all, or at least a very wide range of printed circuit board types with virtually no requirement for individual dedicated hardware for each separate printed circuit board type. Several different types of universal of quasi-universal fixtures have indeed been developed as described briefly below.

One fixture is a universal grid matrix. This system relies on the fact that many printed circuit boards are laid out so that all component holes (which accommodate component leads) and hence all potential test points lie on a regular grid matrix (typically an 0.01" grid). For the class of such boards, fixturing can obviously be effected by means of a corresponding grid matrix array of test probes (typically incorporating 100 test probes per square inch on an 0.01" grid spacing) secured in a probe plate and permanently wired to the ATE system via the fixture interface connector. Hardware or software masking is generally provided to insulate or eliminate from consideration those probes which do not coincide with test points on the particular printed circuit board under test.

Universal fixtures of this type suffer generally from four major drawbacks as follows:

(a) Since all the test probes in the base matrix must be compressed regardless of the number of 'active' probes actually required in a given case, very large forces are required to operate the fixture. As a result, the fixture structure must be very strong (and hence bulky) and, in particular, vacuum-operation (which is generally the simplest and least expensive option) is ruled out;

(b) A large-capacity ATE system must be dedicated to service the fixture (typically, 100 input/output terminals must be dedicated to each square inch of test area in the fixture). This requirement specifically eliminates the potential application of the fixture to loaded board testing for which ATE system capacity is generally extremely limited;

(b) By definition, the fixture cannot be used to test boards on which all of the test points do not lie on a grid matrix of standard dimensions;

(d) While the cost of dedicated hardware (i.e. hardware peculiar to each different type of printed circuit board) is essentially eliminated, the capital cost of the fixturing system is substantial by virtue of the size and strength of its structure and the cost of the large number of test probes which must be permanently installed in it, regardless of the quantity actually involved in a specific test. Moreover, substantial additional cost is involved in the large-capacity ATE system which must necessarily be dedicated to the fixture (see (b) above).

Another type of fixturing system may be referred to as a universal grid with electrical/mechanical probe activation. This device is a development of the basic grid matrix above in which (typically) a special programming card (specific for each different printed circuit board type) is used to mechanically and electrically activate those and only those test probes within the total grid array, which are actually required for the test in progress. While this eliminates the need to compress the entire array (problem (a) in (1) above) the need for the relatively expensive dedicated programming cards degrades the original universality of the system.

Another system is referred to as a universal grid matrix with offset probe head. The concept of the offset probe was introduced essentially to expand the application of the universal fixture to printed circuit boards on which all of the test points do not lie on a standard grid. The offset probe is typically designed so that it can be bent, flexed or inclined away from its original axis to provide a small amount of lateral offset (typically up to 0.07") between its upper extremity (tip) and its lower extremity (base) when inserted in a special offset probe head. The offset probe head, which must be specially designed for a specific printed circuit board, incorporates an array of such probes so distributed and inclined, bent or flexed that their lower, (base) extremities conform to the universal grid matrix while their upper, (tip) extremities conform precisely with the desired pattern of test points on the printed circuit board. Thus, when the offset probe head is suitably inserted between the universal grid matrix and the printed circuit board under test, electrical continuity is established between the test points and the ATE system via the offset probes and their corresponding counterparts within the basic grid matrix.

In order to minimize the recurring dedicated cost re-introduced by the offset probe head, this head is typically constructed of two low-cost plastic plates. The upper probe plate is drilled in the required test point pattern, while the lower (base) plate is drilled in a grid pattern corresponding to the universal grid matrix. In the most common embodiment, straight probes are manually inserted in groups through the test holes in the upper plate and allowed to drop so that their lower extremities become located in laterally-adjacent base holes in the lower plate.

The offset probe head concept extends the application of the universal grid fixture to printed circuit boards whose test points do not conform to any standard grid matrix. The concept suffers from several disadvantages besides the (albeit low) cost of the offset probe heads.

(a) Manual assembly of the offset probe head is time-consuming, particularly in the case of large fixtures incorporating several thousand probes;

(b) Each time an offset probe for a specific printed circuit board is broken down (in order to re-use the offset probes in a different test) and subsequently re-assembled the offset probes will generally acquire new (different) locations in the lower base matrix, due to the somewhat arbitrary nature of the insertion process. Consequently, the test points will be interconnected to a different set of ATE input/output terminals so that the ATE system must be re-calibrated in order to identify faults detected during testing with specific localities on the printed circuit boards under test.

Still another fixture system is referred to as a universal base matrix with offset probes. This type of fixture utilizes the offset probe head of the previous system but dispenses with the original universal grid matrix of probes. In this case, the offset probes within the head interface directly with a grid matrix of fixed contacts which are wired directly to the interface connector.

Thus, instead of being an optional addendum to the universal grid fixture to extend its application to printed circuit boards with off-grid test points, the offset probe head, in this case, is an integral part of the fixture and is used in testing all types of printed circuit board, including those which are laid out on a universal grid. In practice, it provides similar advantages and suffers similar drawbacks to those indicated for the previous system.

Apart from the specific individual disadvantages of each type of the four universal fixturing systems described above, it should be noted that all of these systems are generally unsuitable for loaded board testing for two reasons, namely:

(1) As noted earlier, they require a very large ATE system capacity (typically, 100 input/output terminals per square inch of test area) which is generally not available on loaded board test systems;

(2) Unlike the simple continuity testing required for bare (unloaded) boards, loaded board testing involves the use of several different classes of input/output lines (e.g. power busses, analog and digital signal lines of various types, ground lines, etc.) Clearly, none of the universal fixturing systems outlined above provides any means for differentiating between these various types of test requirements and, hence, for ensuring the correct interfacing for each test point with the appropriate type of input/output terminal on the ATE system.

OBJECTS OF THE INVENTION

Accordingly, it is an object of the present invention to provide an improved automatic test system and in particular a novel automatic fixturing system for printed circuit board testing.

Another object of the present invention is to provide automatic means for rapidly assembling and configuring ATE fixtures for use in testing printed circuit boards, and for subsequently disassembling said fixtures so that the components thereof, including the test probes, can be reused repeatedly in a series of different fixture configurations.

Another object of the present invention is to provide a machine-insertable offset test probe which will permit automatic assembly and configuration of said fixtures and which can be reused repeatedly in a series of different fixture configurations.

Another object of the present invention is to provide a flexible probe capable of significantly greater maximum lateral offset than existing offset probes, thereby permitting a wide range of alternative orientations of the probe within the offset fixture.

Yet another object of the present invention is to provide means for controlling said fixture assembly process by computer so that the specific orientation of each offset probe within the assembled fixture can be selected from said alternative orientations according to a special software program so as to optimize the application of the fixture in testing printed circuit boards.

Yet another object of the present invention is to provide a universal fixturing system for testing unloaded printed circuit boards which requires a minimum number of ATE terminals per unit test area to be dedicated to it.

Yet another object of the present invention is to provide a universal fixturing system for testing unloaded printed circuit boards which requires a minimum number of ATE terminals per unit test area to be dedicated to it and which will provide each and every test point with access to any one of a variety of different types of input/output terminals on the ATE system so that the specific electrical requirements for loaded board testing can be satisfied in each and every case.

Yet another object of the present invention is to provide a total computer-integrated test system for both loaded and unloaded printed circuit boards in which test strategy development, fixture assembly and configuration and board testing can be accomplished under the control of a single internal or external host computer.

A further object of the present invention is to provide an improved automatic test system probe construction.

A further object of the present invention is to provide a universal test system that is preferably provided in separate sub-systems including a sub-system for test head assembly and a sub-system for testing.

Still another object of the present invention is to provide an improved automatic test system that provides for the efficient storage of probes and the likewise efficient transfer of probes to the test head under precise probe transfer control.

Yet another object of the present invention is to provide an improved automatic test system that incorporates both a primary magazine for probe storage and a secondary magazine for probe storage so as to more readily enable readying of a second test head for testing while a first test head is under test.

SUMMARY OF THE INVENTION

In accordance with the invention, there is provided a test system that is provided in different sub-system sections, including an assembly system where the test head is assembled and a testing system wherein the printed circuit board that is to be tested is interfaced with the test head. There is also provided computer control for carrying out operations in conjunction with both the assembly system and the test system. At the assembly system, the test head is assembled. In this connection, there is provided at the assembly system, a resident probe magazine and one or more secondary probe magazines which can be populated with a variety of probe type mixes to suit the particular test operations of the user. In addition to the magazine, there is also provided a base plate and a probe plate. Both of these are drilled to receive the probes from the magazine. The base plate is drilled in a standard 0.100" grid pattern. The probe plate may be drilled in a similar pattern or any desired test point pattern for a specific printed circuit board type. Once the test head is assembled at the assembly system, then it is manually transferred to the test system or fixture system. As part of the test system, there is provided a base receiver that accepts the assembled test head. The base receiver is wired into an interface panel. The test system is provided with vacuum actuation with pneumatic assist for rapid response. The level of vacuum is computer-controlled to match the test point count with a maximum capacity of 10,000 points.

More particularly, in the circuit board testing system of the invention, there is provided apparatus for assembling a test head, which apparatus comprises a base plate, a base plate table for supporting the base plate, and a probe plate along with a probe plate table for supporting the probe plate. The probe plate is supported adjacent to the base plate and in the preferred embodiment is supported below the base plate in between the base plate and a probe magazine. The base plate and probe plate are both provided with a matrix of holes for receiving probes. The probe magazine houses a plurality of probes and is supported on a magazine table for supporting the magazine adjacent to the base plate and probe plate. Drive means are provided for Y-drive of the base plate. Similarly, drive means are provided for Y-drive of the probe plate. There is also a drive means for Y-drive of the magazine. These drive means are adapted to align the holes in the base and probe plates with probes in the magazine. In accordance with the invention, there is furthermore provided injector means adapted to be maintained in a basic stationary position over the moving base plate, probe plate, and magazine, but adapted to contact a selected series of probes for transfer thereof from the magazine to a position supported intermediate the base and probe plates. Standoffs are provided for holding the base plate and probe plate in fixed relative position once all of the probes have been inserted. This forms the test head. The drive means for the probe plate table operates so that the probe plate may be X and Y positioned relative to the base plate to provide base plate and probe plate hole alignment. The X and Y probe plate positioning relative to the base plate is generally adapted to cover a small radial area permitting an offset of up to 0.25". The magazine table drive is preferably a stepped drive in increments of 0.1".

As indicated previously in association with the invention, there is preferably provided a secondary magazine and a plurality of probes supported in this magazine. The secondary magazine is supported by the base plate table in a position forward of the base plate. The injector means is adapted to transfer probes from the secondary magazine to the primary magazine in vacant locations thereof and is also adapted in accordance with the control of the invention for providing transfer in either direction between the primary and secondary magazines. The injector means includes at least one upper injector rod and means supporting this upper injector rod above the base and probe plates along with at least one lower injector rod and means for supporting the lower injector rod below the base and probe plates. Means are provided for transferring the injector rods toward each other in alignment with each other to grip respective opposite ends of the probe.

In accordance with a preferred embodiment of the invention, the injector means comprises a plurality of injector rods separated into upper and lower injector rod banks. One bank is disposed above the base and probe plates and the other is disposed below the base and probe plates. Means are provided for supporting the upper and lower injector rod banks. This means comprises an upper stationary beam and an upper moving beam disposed between the upper stationary beam and the base plate. There is also provided a lower stationary beam and a lower moving beam that is disposed between the lower stationary beam and the base plate. Each beam has associated therewith, electrical solenoids that are selectively actuated to hold the injector rods supported therein. The unselected injector rods are held under solenoid control in the stationary beams while the selected injector rods are held under solenoid control in the moving beams. Means are provided for controlling motion of the moving beams to enable probe transfer between the test head and probe magazine. This means for controlling beam motion is comprised of a harmonic drive means and a differential drive means. In this connection, there are provided upper and lower beam drive rods supported from a differential beam. The harmonic drive means includes a rotating cam operating a push rod that drives the differential beam. The differential drive means includes a rack and pinion for imparting opposite translation to said beam drive rods for providing gripping action on the probe.

In accordance with the testing system of the present invention, the assembled test head which is comprised of a probe plate, a base plate, and a plurality of probes supported therebetween with means for securing the base plate and probe plate in fixed relative position, is comprised of a base receiver plate having support contacts adapted to conductively couple to probes of the test head at the test head base plate. There is defined a vacuum chamber about the test head including in part, the base receiver plate and also in another part, a pressure plate forming a top of the vacuum chamber having the printed circuit board that is being tested disposed between the pressure plate and probes that extend from the probe plate and that are in contact with test points on the printed circuit board. Means are provided for drawing a vacuum on the vacuum chamber to force intimate contact between the test head, printed circuit board and base receiver plate. The vacuum chamber is defined also by a peripheral frame having resilient sealing means disposed between the top of the frame and the pressure plate. The vacuum is drawn by providing at least one vacuum port in the base receiver plate. The overlying pressure plate is preferably adapted for support in a sliding arrangement so that it can be slid over the vacuum chamber and away from the vacuum chamber when the test head is to be inserted or removed. There are also preferably provided a series of air cylinders for initially urging the pressure plate into contact with the peripheral frame. It is after this initial contact occurs via the air cylinders, that the vacuum is drawn to assure intimate contact. It is furthermore noted that the vacuum pressure that is applied is controlled under computer control so that the amount of vacuum pressure is a function of the number of probes that there are in the test head. In this way, the proper per probe pressure is applied. This assures that sufficient pressure is applied, but at the same time without creating any over pressure condition.

BRIEF DESCRIPTION OF THE DRAWINGS

Numerous other objects, features and advantages of the invention should now become apparent upon a reading of the following detailed description taken in conjunction with the accompanying drawings, in which:

FIG. 1 is a perspective view of the automatic test system of the present invention illustrating the basic sub-assemblies of the system;

FIG. 2 is a side elevation view partially broken away of the test head assembly system as taken along line 2—2 of FIG. 1;

FIG. 2A is a perspective view showing further details of operation with regard particularly to the moving tables including the base plate table, the probe plate table, and the magazine table;, FIG. 3 is a top plan view of the test head assembly system as taken along line 3—3 of FIG. 2;

FIG. 4 is a partial cross-sectional view of the table assembly in a side elevation as taken along line 4—4 of FIG. 3;

FIG. 5 is a partial cross-sectional view similar to FIG. 4 but taken along line 5—5 of FIG. 3;

FIG. 8 is a partial cross-sectional front elevation view of the beam assemblies as taken along line 8—8 of FIG. 7.;

FIG. 9 is a partial cross-sectional front elevation view of the beam drive assembly as taken along line 9—9 of FIG. 7;

FIG. 10 is a partial cross-sectional top plan view of the beam drive assembly as taken along line 10—10 of FIG. 9;

FIGS. 15A–15G illustrate a sequence of operation relating to injector rod function;

FIG. 21 is a side elevation view partially broken away of the beam assemblies in which the harmonic drive is at bottom dead center;

FIG. 22 is a side elevation view partially broken away of the beam assemblies in which the harmonic drive is at top dead center;

FIG. 23 is a side elevation view partially broken away of the beam assemblies in which the harmonic drive returns to a bottom dead center position in readiness for engagement with a probe;

FIG. 24 is a side elevation view partially broken away of the beam assemblies in which the differential drive comes into play causing the probe to be gripped;

FIG. 25 is a side elevation view partially broken away of the beam assemblies in which the harmonic drive moves toward a top dead center position causing transfer of the probe out of the magazine;

FIG. 26 is a large view of the probe cradled by the injector rods in an intermediate position partially between the probe and base plates;

FIG. 27 is a side elevation view partially broken away of the beam assemblies in which the harmonic drive is at a position just before top dead center in which the probe is almost seated in the test head;

FIG. 28 is an enlarged cross-sectional view of the probe and position about to spread the base receptacle of the base plate;

FIG. 29 is a side elevation view partially broken away of the beam assemblies in which the harmonic drive is at its top dead center position with the probe completely transferred;

FIG. 30 is an enlarged view of the probe in position in the test head and also illustrating the maximum degree of offset in between the solid and phantom positions of the probe illustrated;

FIG. 33 is a schematic prior art cross-sectional view of an offset probe;

FIG. 34 is an enlarged view of the probe such as previously illustrated in FIG. 30 with the probe offset illustrated and showing further sectional details of the articulated probe;

FIG. 37 is a top plan view of the secondary magazine;

FIG. 38 is a cross-sectional view taken along line 38—38 of FIG. 37 showing further details of the secondary magazine and the support stand-off associated therewith;

FIG. 39 is a side elevation view of the testing sub-system shown with the pressure plate in solid in a retracted position and in phantom in a position overlying the vacuum chamber;

FIG. 40 is a top plan view as taken along line 40—40 of FIG. 39 with the apparatus partially sectioned away to illustrate further details;

DETAILED DESCRIPTION

Figure 6:
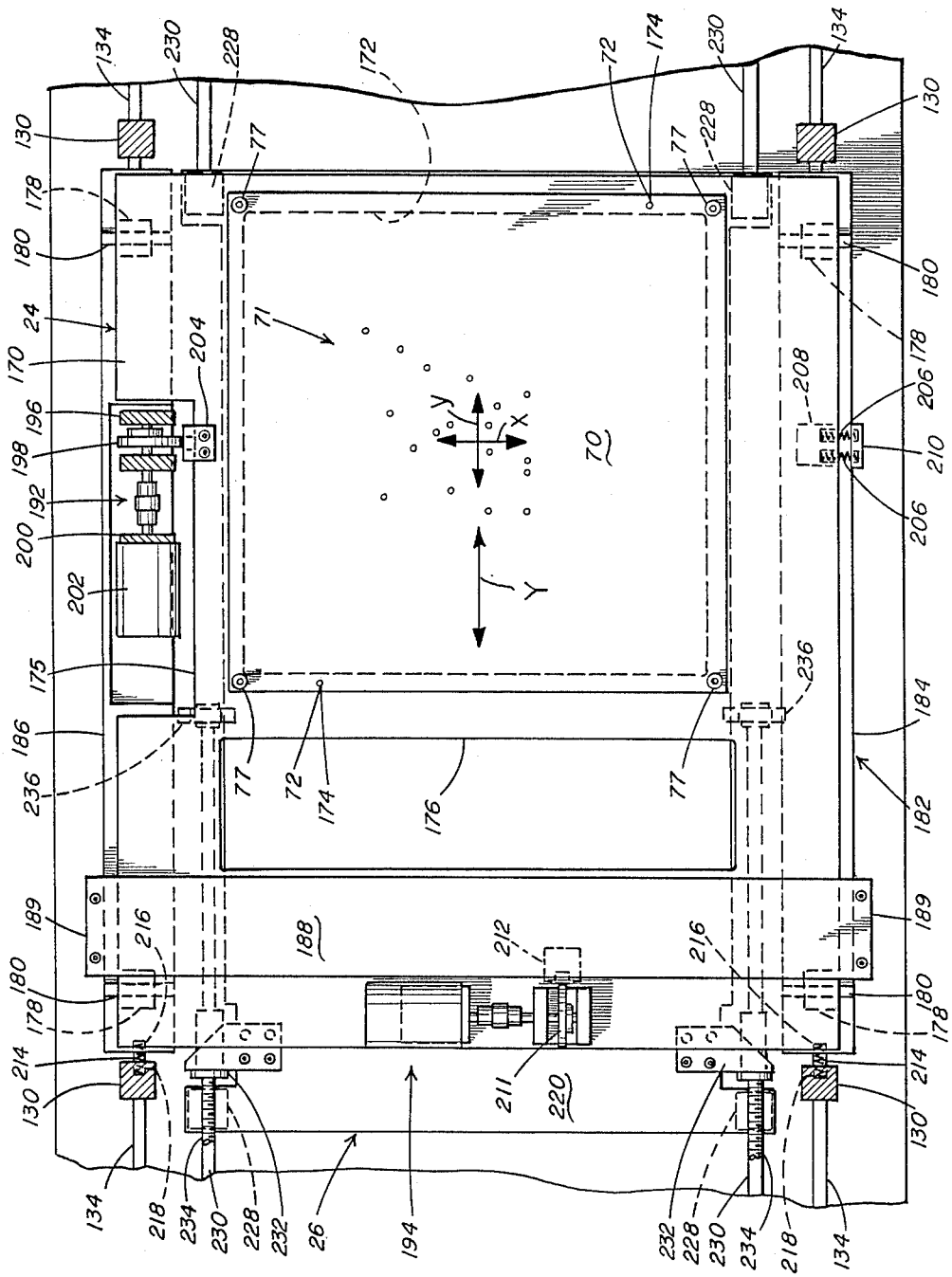
FIG. 6 is a partial cross-sectional plan view of the probe plate and table as taken along line 6—6 of FIG. 4.

FIG. 1 of the present application is a perspective view illustrating the overall automatic test system of the present invention. The system 10 is comprised in general of a test head assembly system 20, a fixture system 30 and a control system 40. As illustrated in FIG. 1, the control system 40 may include a computer 42, a disk drive 44, a high speed paper tape punch-reader 46, and a printer 48. FIG. 1 also illustrates a CRT display 41 and associated keyboard 43.

As indicated previously, the system of the invention includes a test head assembly system where the test head is assembled and disassembled. The system includes a resident probe magazine and one or more auxiliary probe magazines which can be populated with a variety of probe-type mixes to suit the test operations of the particular user. The probe itself is an improved articulated design which permits a much greater degree of operational offset (up to 0.200") and a substantially short length (typically 1.85"). The tip of the probe is adapted to deflect in a direction normal to the probe plate, regardless of the degree of offset present.

The test head system is comprised of a base plate and a probe plate that is drilled in the desired test point pattern for a specific printed circuit board type. A universal grid probe plate is supplied for use with printed circuit boards laid out on a 0.100" grid pattern. Connector pins are used to link the base and probe plates following probe population. The test head provides a maximum 25" by 25" testable area. The assembly is light in weight (typically 15 pounds) and low in profile (2.2" thick) to facilitate handling and shipping.

The fixture system 30 employs a base receiver designed to accept the assembled test head. The base receiver is wired into an interface panel which is interfaced to the automatic test system of the user. The receiver/interface wiring is uniquely configured in conjunction with the systems software to permit a substantial reduction in the tester capacity (number of I/O points) required to service the base grid. In a typical application, the 25" by 25" test area may be fully serviced by a test or with an I/O count only 15% to 20% higher than the maximum number of test points on any further circuit board type to be tested.

The fixture system of the invention features vacuum actuation with pneumatic assist for rapid response. The level of vacuum is computer-controlled to match the test point count with the maximum capacity of 10,000 points. The printed circuit boards are manually loaded directly onto the test head. Subsequent operation of the test cycle is fully automatic. The system is designed to accommodate both bare and loaded boards.

In FIG. 1 the control system 40 comprises the components previously described. The programming of the system may be carried out via paper tape, mag tape, floppy disk or via a communications link with a host system. Full editing capability is provided to permit the edition, relocation and deletion of test points, individually or collectively via the keyboard 43. Upon completion of data entry, the system software develops a special test head design program in which it assigns each test point to a specific fixture interface node, calculates the appropriate positioning and offset to each probe required to effect the assigned connections and develops the motion control program to run the assembly system. The resultant program is stored on hard disk or floppy disk and a paper tape is generated in the users format for numerical control drilling of the probe plate. In the system of the invention if the printed circuit board test point pattern does not lie on a 0.100" grid, a dedicated probe plate is used. A blank probe plate is drilled using the drill tape generated by the system. The probe plate and associated floppy disk carrying the test head assembly program represent the only dedicated cost and storage requirements per each printed circuit board type. Before the newly-drilled probe plate is first assembled in a test head, it is processed through the assembly system which automatically checks each individual hole for location and size. Any missing or blocked hole that is detected is indicated on a color coded print out for appropriate corrective action.

Whenever it is required to assemble a test head for a particular printed circuit board type, the appropriate probe plate and a standard base plate are inserted separately in the assembly system. Driven by the related assembly program, the system populates the test head with probes in the specific mix of size and type requested. Assembly is typically accomplished in a few minutes. Locking inserts are installed to complete the test heads. Once assembled, the test head is then removed and inserted in the fixture system. In connection with FIG. 1 the assembly system is illustrated at 20 and the fixture system at 30. Following the printed circuit board test operation, the test head can either be stored temporarily pending further use or returned to the assembly system for disassembly.

Following installation of the assembled test head in the fixture system, the printed circuit boards are loaded directly onto the test head with location pins being provided. Upon actuation, a panel (plate) is automatically positioned over the printed circuit board and test head and drawn down pneumatically to seal a vacuum dam surrounding the base receiver. A computer controlled degree of vacuum is then applied to the printed circuit board against the probe array with a force appropriate to the collective probe spring force. Testing is initiated by signal to the test system. Upon receipt of a return signal from the tester, the panel is raised and withdrawn automatically from the test head, and the board removed manually. Optical sensor may be used to detect the presence of an obstruction in the fixture well and shut the system down to prevent harm to the operator or to prevent mechanical damage.

In accordance with the system of the invention, probe monitoring and preventive maintenance is employed on a regular basis to ensure that each and every probe in the system magazine is kept within appropriate operational specifications. Monitoring involves the continuous or periodic acquisition of and storage of several different types of data on each probe. The cumulative number of loading cycles is kept track of. The cumulative number of flexural cycles is accounted for. The cumulative number of test cycles is taken into account. The current value of probe resistance is measured. The current value of probe spring rate is measured. At recommended periods, the preventive maintenance program is invoked to automatically eject from the probe magazines all probes which no longer lie within defined operational limits. These probes can then be examined and/or removed permanently from the system.

As indicated previously, the system of the present invention comprises a test head assembly system 20, a fixture system 30, and a control system 40. The assembled test head is schematically illustrated for example, in FIG. 17, at 50. The test head is comprised of a base plate 60 and a probe plate 70. The primary magazine is illustrated at 80 in the drawings and the secondary magazine is illustrated at 90. The test head, of course, supports the probes 100.

Figure 7:
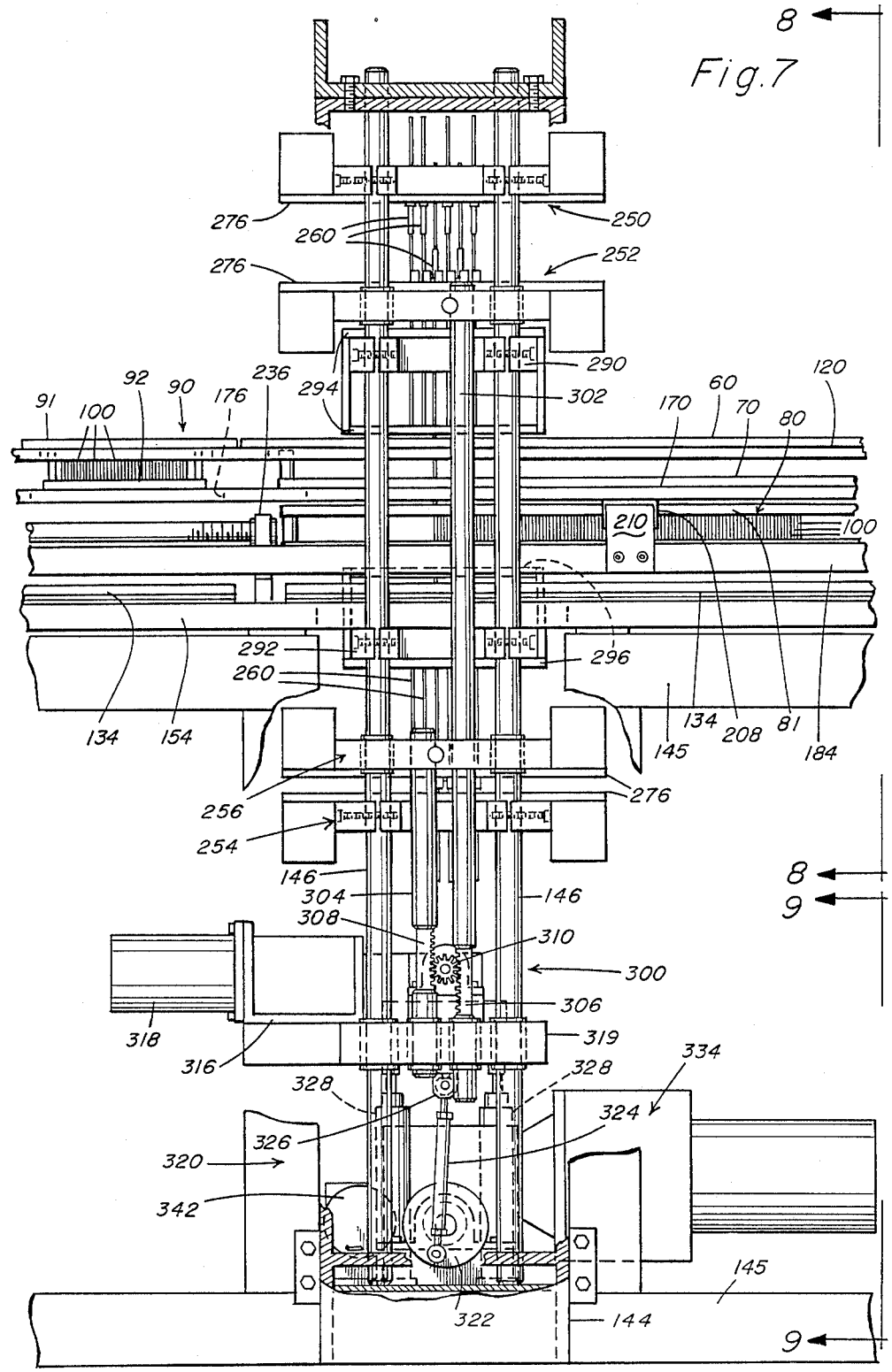
FIG. 7 is a partial cross-sectional side elevation view of the beam assemblies as taken along line 7—7 of FIG. 3.

The test head assembly system 20 illustrated in the drawings is comprised of four major components including a base plate table assembly 22, a probe plate table assembly 24, a magazine table assembly 26, and an injector rod assembly 28. The base plate table assembly 22 carries the base plate 60 such as illustrated in FIGS. 2–5. The base plate table assembly 22 also supports the secondary magazine 90 such as illustrated in FIG. 7 disposed adjacent to the base plate 60. The base plate table assembly 22 is adapted for forward and back motion in a Y or horizontal axis essentially through the injector rod assembly 28 such as illustrated in FIG. 2. FIG. 2 illustrates the base plate table assembly 22, the probe plate assembly 24, the magazine table assembly 26 shown in dotted outline and the injector rod 28 also shown in dotted outline. FIG. 2A is a perspective view illustrating the tables and the manner in which the different tables translate as illustrated by the X and Y axes set forth.

The probe plate table assembly 24 carries the probe plate 70. The probe plate assembly 24 is dependent upon the base plate table assembly for its major Y-axis movement. However, the probe plate table assembly 24 has its own X-Y drive system which enables it to shift the probe plate 70 up to 0.25" off center relative to the base plate in order to allow for the off-centering of probes.

The magazine table assembly 26 carries the primary magazine 80 such as illustrated in FIG. 5. The magazine table assembly 26 is adapted to move in a horizontal Y-axis (see FIG. 2A) through the injector rod assembly 28 and is synchronized to move along the Y-axis with the magazine matrix in perfect alignment with the desired section of matrix in either the base plate or secondary magazine. This movement is controlled in 0.10" increments. Both the magazine table assembly 26 and the base plate table assembly 22 can also traverse rapidly to facilitate loading and unloading of the test head or magazines.

The test head is loaded and unloaded with the base plate table assembly 22 in its forward position which is the left most position in FIG. 2. The base plate table assembly 22 is in this forward position regardless of the position of the magazine table assembly 26. A secondary magazine 90 is loaded and unloaded with the base plate table assembly 22 in its full rearward position. The primary magazine 80 is loaded and unloaded with the base plate table assembly 22 in its forward position and with the magazine table assembly in its full rearward position. The injector rod assembly 28 such as illustrated in FIGS. 2, 7 and 8 shifts probes 100 between the primary or secondary magazines and the test head.

Referring now to FIGS. 2, 2A, and 3, the base plate table assembly 22 comprises a base plate table 120 which is a flat aluminum plate preferably ½" thick. The base plate table 120 supports the base plate 60 and also supports the secondary magazine 90 as illustrated in FIG. 7. In one example in accordance with the invention, the base plate 60 is 31" square and may have up to 25" square of test area. In the drawings this area is actually shown, for simplicity, as being approximately 13" square.

The base plate 60 has two locating holes 66 as depicted in FIG. 3 which are adapted to receive locating pins 124. The locating pins 124 are press fit into the table 120. The locating pins 124 along with the holes 66 align the base plate 60 over the clearance hole 122 which is disposed in the base plate table 120. The clearance hole 122 may be 29" square with a 1" overlap all around.

The secondary magazine 90 may have a dimension of 9" by 30½" and likewise is aligned over a clearance hole 126 provided in the base plate table 120. This alignment is provided by means of the locating holes 94 in the top plate 91 of the secondary magazine 90. These locating holes align with the secondary magazine locating pins 128 which extend upwardly from the base plate table 120. In this regard refer to FIGS. 37 and 38 which shows the top plate 91, the locating holes 94, and the locating pins 128. The secondary magazine also includes, in addition to the top plate 91, a bottom plate 92 and base receptacles 93 mounted within the top plate 91 as illustrated in FIG. 38. Standoffs 96 separate the top plate 91 and the bottom plate 92 as also illustrated in FIG. 38. FIG. 38 also shows a series of special probes 98 supported within the secondary magazine 90. Reference is also made to FIG. 7 which shows the secondary magazine 90 and its placement relative to the base plate table 120.

The base plate table 120 is supported by four posts 130 such as illustrated in FIG. 2. The posts 130 are also shown in dotted outline in FIG. 3. As illustrated in FIG. 4, the posts 130 are supported from slides 132 which in turn ride on outer rails 134. FIG. 6 shows the posts 130 and rails 134. The rails 134 are actually provided in two sets, one forward and one rearward separated by a gap as illustrated in FIGS. 4 and 7. The gap is provided on the inner set of rails 134 in order to make provision for a bearing block which is illustrated in FIG. 7 as the bearing block 236.

Base plate table 120 is driven from front to rear along the Y-axis by two ball screw followers 136 which are attached to the table 120. In this connection not the followers 136 in FIG. 3 and in the side elevation view in FIG. 4. These followers 136 receive lead screws 138 that are supported at one end by means of bearings 140. FIG. 3 illustrates the lead screws 138, followers 136 and bearings 140. The bearings 140 are mounted in extensions 142 of the vertical U-channel members 144 illustrated in FIG. 3. The vertical U-channel members 144 support the Thompson shafts 146 which in turn support and guide the injector rod assembly 28.

The lead screws 138 are supported at their driven ends by support blocks 148 also illustrated in FIG. 3 along with bearings 150. The support blocks 148 are mounted on platform 152 which is mounted to the rear on table 154. The support blocks 148 carry right angle drive units 156 which are connected by universals 158 to the lead screws 138. The right angle drive unit is driven from the drive shafts 160 which couple at dual outputs from the right angle drive unit 162. The unit 162 as illustrated in FIG. 3 is supported by the motor bracket 164 and is connected to the stepper motor 166 by the universal 168.

It is noted herein that when reference is made to a Y-axis drive it is the direction indicated by the Y arrow in FIG. 3. In this connection also note FIG. 6 which shows the corresponding transverse or X-axis drive as indicated by the X arrow in FIG. 6.

The X drive assembly 192 such as illustrated in FIG. 5 is supported on the underside of the base plate table 120. Also refer to FIGS. 2A and 3 which show the X drive assembly 192. This provides the X drive for the probe plate table 170. The probe plate table 170 is disposed directly below the base plate table 120. The probe plate table 170 is centered between the posts 130 as illustrated in FIG. 6. FIG. 5 shows the base plate table 120 and therebelow the probe plate table 170 disposed in spaced relationship. On the base plate table 120 is the base plate 60 and on the probe plate table 170 is the probe plate 70 as illustrated in FIGS. 4 and 5.

The probe plate table 170 has a clearance hole 172 for the probe plate 70. FIG. 6 illustrates the clearance hole 172 in dotted outline. FIG. 6 shows the probe plate 70 with its matrix of holes at 71 and including locating holes 72 adapted to engage with locating pins 174 associated with the probe plate table 170. The probe plate table 170 also has a clearance hole 176 illustrated in FIG. 6 for the secondary magazine bottom plate 92. In this regard refer to FIG. 7 which shows the clearance hole 176 in dotted outline and the associated bottom plate 92 of the secondary magazine 90. This clearance pole 176 is larger than plate 92 so as not to interfere with X-Y probe plate table movement. Clearance hole 172 may be 26" square while the probe plate 70 may be 28" square.

The table 170 is supported on slides 178 which are in turn supported on short rails 180 such as illustrated in FIG. 4. FIG. 6 also shows these short rails 180 disposed in an X direction on the frame assembly 182. The frame assembly 182 is comprised of a left side horizontal member 184, right side horizontal member 186, cross member 188 and standoffs 189. The cross member 188 links together the horizontal members 184 and 186 so that the frame assembly moves as a single unit in the Y direction on slides 190 on outer rails 134. The left and right side horizontal members 184 and 186 are approximately $\frac{1}{2}$" shorter than the distance between the posts 130 so as to allow up to $\frac{1}{4}$" on each side of center of the probe plate table movement.

The X drive assembly 192 such as illustrated in FIGS. 2A, 5 and 6 drives the probe plate table 170 in an X direction on rails 180 against a spring pressure up to $\frac{1}{4}$" off center in relation to the base plate 60 which overlays the probe plate 70. The X drive assembly 192 is comprised of cam bracket 196, cam 198, both illustrated in FIG. 5, motor bracket 200, and motor 202. Refer also to FIG. 6 which shows the motor 202 supported from the motor bracket 200 and in turn driving the cam 198.

As indicated previously, the X drive assembly 192 is mounted to the underside of the base plate table 120 and passes through the clearance hole in the probe plate table 170. The X drive assembly 192 acts against the cam follower 204 illustrated in FIG. 6 and which is mounted on the probe plate table 170. Spring pressure to hold the follower 204 against cam 198 is provided by springs 206 illustrated at the bottom of FIG. 6. The springs 206 are held in a bracket 208 which in turn is mounted on the underside of the table 170 in a position opposite to the cam follower 204. FIG. 6 also shows the spring retainer 210 which is mounted on horizontal member 184.

The Y drive assembly 194 operates in a similar manner to that of the X drive assembly 192 that has just been described. The Y drive assembly 194 is mounted on top of the table 170 and its cam 211 pushes against the cam follower 212 which is mounted on the base plate table 120. Also refer to FIG. 2A.

Thus, the Y drive assembly 194 moves with the table 170 and reacts against spring pressure of springs 214 (see FIG. 6) which are seated in retaining holes 216 in members 184 and 186. The springs 214 are also held in retaining holes 218 and posts 130 as illustrated in FIG. 6. Thus, the X drive assembly 192 and Y drive assembly 194 shift the probe plate relative to the base plate up to $\frac{1}{4}$" radius to find holes drilled in the probe plate which are not aligned with the matrix of the base plate. In this regard note FIG. 14 which shows this $\frac{1}{4}$" radius alignment.

Reference is now made to the magazine table 220 such as illustrated in FIG. 5 and also in the perspective view of FIG. 2A. The table 220 has a recessed seat 222 such as illustrated in dotted outline in FIG. 8 and three locating pins 224. Clearance hole 226 allows axis to probes 100 from the injector rods. The magazine table 220 is disposed on slides 228 illustrated in FIG. 8 which are mounted on inner rails 230. The magazine table 220 is driven in a Y direction by ball screw followers 232 mounted on the table 220. FIG. 6 illustrates the screws 230 which are supported at their forward end by bearing block 236 and the lead screw 234. The followers 232 are driven by stepper motor 238 illustrated in FIG. 3 which is mounted on bracket 240. Bracket 240 is in turn attached to the table top 154.

It is noted that the drive system associated with the magazine table 220 is substantially identical to the drive system associated with the base plate table drive. This drive system includes the right angle drive unit 242, shafts 243, and a pair of additional drive units 244. Also illustrated is the support tlocks 245, bearings 246 and universal 247.

Figure 11:
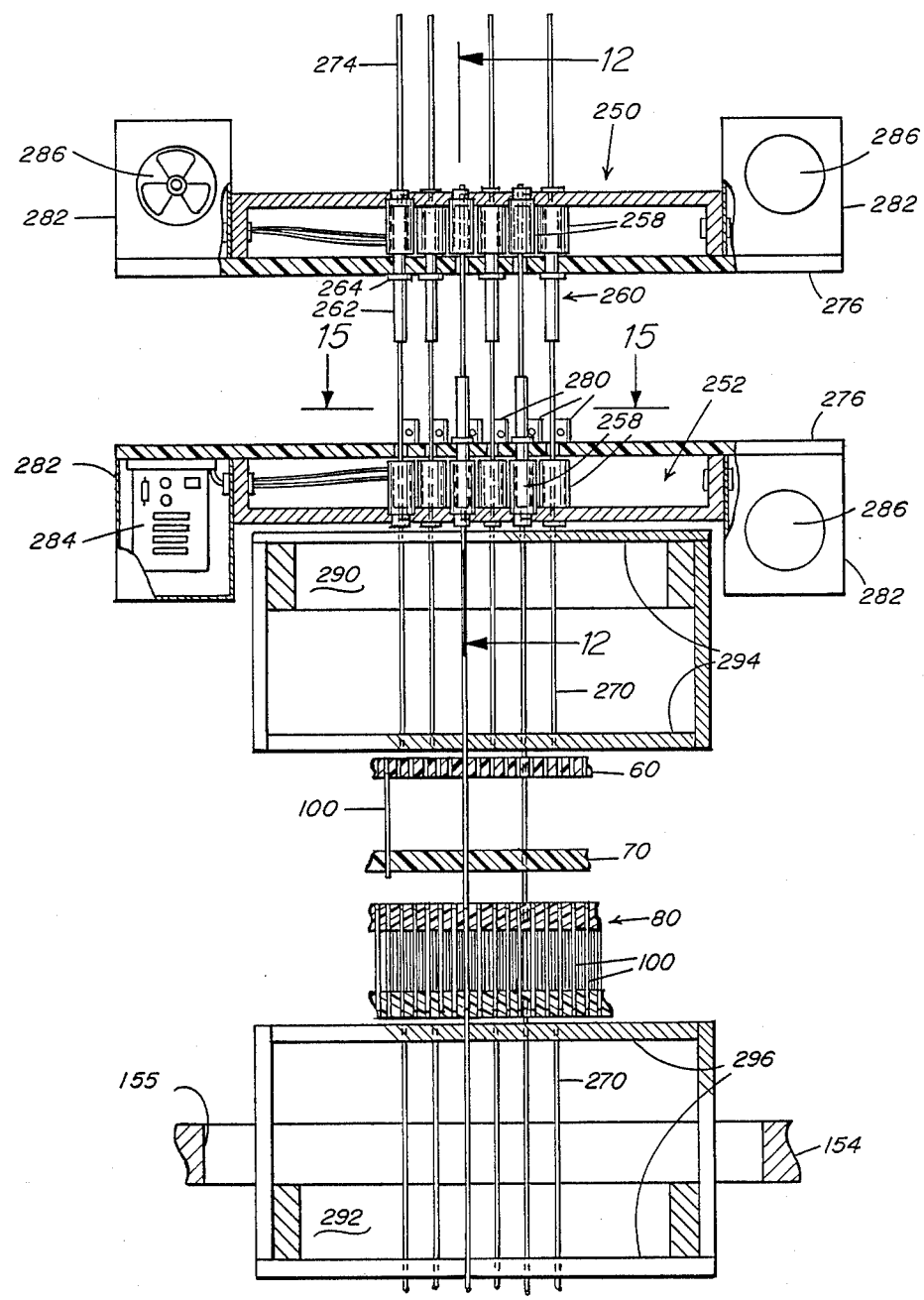
FIG. 11 is a partial cross-sectional side elevation view partially broken away illustrating the upper stationary and movable beam assemblies as taken along line 11—11 of FIG. 8.

FIG. 2 shows in dotted outline the injector rod assembly 28. This assembly is comprised of upper stationary beam 250 and upper moving beam 252 both of which are supported at the top of the injector rod assembly above the tables 120 and 170. The injector rod assembly 28 also comprises a lower stationary beam 254 and lower moving beam 256. FIGS. 7 and 8 also show the upper beams 250, 252 and lower beams 254, 256. Each of these beams carry solenoids 258 such as illustrated in FIGS. 8 and 11. The solenoids 258 selectively grab injector rods 260 which are adapted to move probes from the magazine to the test head or alternatively from the primary magazine 80 to the secondary magazine 90.

The moving beams 252 and 256 grab the selected injector rods 260 under control of the solenoids 258. The injector rods 260 are controlled by a differential drive means 300 for 0.4" movement to make contact with the probes and furthermore controlled by harmonic drive means 320, for 2.6" drive for actual travel motion of the probes. In this connection refer to FIG. 7 which shows the differential drive means 300 and also the harmonic drive means 320.

Figures 12, 13, 14:
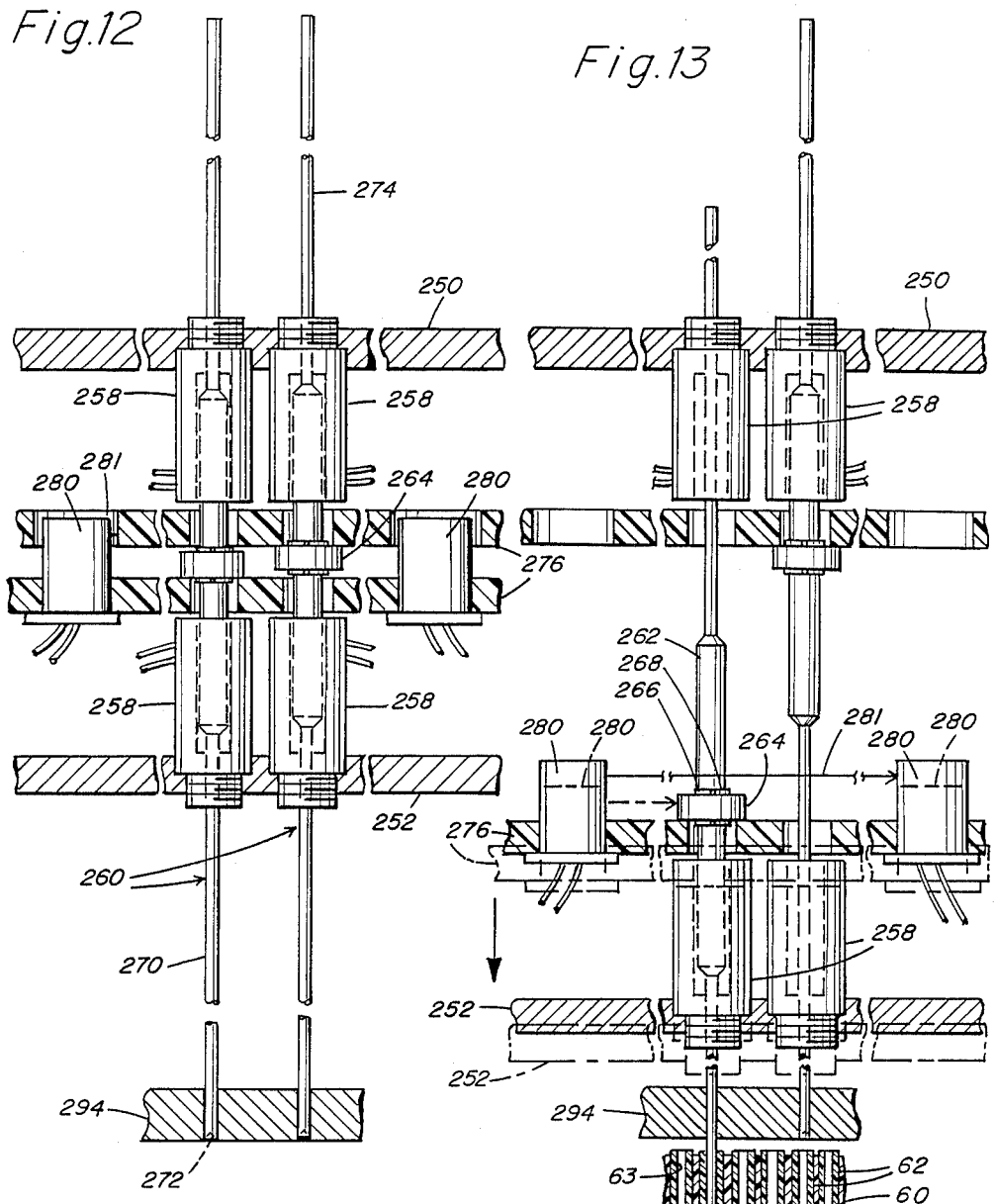
FIG. 12 is a partial cross-section front elevation view partially broken away illustrating the upper stationary and lower moving beams with the moving beam in a top dead center position, as 12—12 of FIG. 11.
FIG. 13 is a partial cross-sectional front elevation view as in FIG. 12 illustrating the top moving beam partially in a downward position to illustrate the blocked hole in the probe plate and the electric eye being interrupted.
FIG. 14 is a partial cross-sectional view taken along line 14—14 of FIG. 13 illustrating the manner in which the x-y movement of the probe plate hunts for a hole within a small prescribed circle.

Each of the injector rods 260 comprise a main stem 262 such as illustrated in FIGS. 11-13. At about the middle of the main stem 262 is a fiber washer 264 held in place by retaining rings 266 held in grooves 268 such as noted in FIG. 13. The injector rod 260 also comprises a thin rod portion at a probe end 270. At the end 270 there is also provided a dimple 272 as noted in FIG. 12 that provides a small recess for engaging with the probe 100. The injector rod also includes a thin rod portion at the free end 274 as illustrated in FIGS. 11 and 12. FIG. 13 also shows the solenoids 258 and the manner in which the solenoids can control the position of the injector rods.

The stationary beams 250 and 254 are clamped to vertical Thompson rods 146 such as illustrated in FIG. 7. These vertical Thompson rods 146 are mounted in vertical U-channel members 144 which are bolted to the main frame assembly 145. The members 144 and the rods 146 are also depicted in FIGS. 2-5. It is noted from FIG. 3 that there are two pairs of rods 146 one pair on each side of the machine. The mainframe assembly 145 is comprised of 3" square steel tubing, a section of which is illustrated in FIG. 7.

The upper and lower moving beams 252 and 256 are slidably mounted on the Thompson rods 146 and are driven from a differential drive means 300 and harmonic drive means 320 via the upper moving beam drive rod 302 and the lower moving beam drive rod 304. Mounted to each of the beams 250, 252, 254 and 256 are G10 plates, 276 as noted in FIG. 7. As noted in FIG. 11 the plates 276 carry solenoid drive cards 284 each disposed inside of the housing 282. Moreover, the plate 276 as illustrated in FIG. 11 carries the electric eyes 280.

Also note FIGS. 12 and 13 which show the electric eyes 280. The operations of these will be described in further detail hereinafter.

FIG. 11 shows leads coupling from each of the solenoid drive cards 284 to respective solenoids. The solenoid drive cards contain voltage controlling circuitry that is adapted to individually power each solenoid 256. The drive card operates so that a controllable voltage may be applied to the solenoids to provide different levels of force of grip controlled by the solenoids. The cards 284 plug into receptacles on the plates 276 and are cooled via fans 286 that blow air through the housing 282.

The electric eyes 280 are mounted on the G10 plates 276 on the moving beams 252 and 256. In this regard note FIG. 11 and the electric eyes mounted upon the plate 276 associated with the moving beam 252. The electric eyes 280 pass through clearance holes in the plate 276 of the stationary beam. In this regard note FIG. 12 and the electric eye 280 mounted on the lower plate 276 extending into a clearance hole 281 in the upper plate 276. This occurs when the moving beams are closest to the stationary beams in which case there is approximately 3/16" between the plates 276 as in the position of FIG. 12. As noted in FIG. 12 when the moving and stationary beams are in their closest position the beam 281 from the electric eye 280 is interrupted. There is actually an interruption in the beam between the two electric eyes in FIG. 12. Also note FIG. 13 in which the beam 281 is now present between the electric eyes. It is also noted in FIG. 13 that there is illustrated in dotted outline an interfering path from one electric eye to the other as occasioned by the presence of the washer 264.

A sensing system operating off the harmonic drive system disables the electric eye sensing until the moving beams are moved far enough away from the stationary beams so that the beam is clear to pass as illustrated in FIG. 13. If a hole is blocked or there is misalignment, the injector rod 260 pops out of its solenoid hold and the fiber washer 264 interrupts the beam as illustrated in dotted outline in FIG. 13. When this occurs, movement of the beams is stopped before any damage occurs.

It is noted that in FIG. 13 there is shown a misalignment between the probe 100 and a hole in the probe plate 70. Thus, as the moving beam 252 moves downwardly the injector rod 260 will stay in position. When the beam has moved downwardly to the dotted position the injector rod is maintained in the same position and thus as indicated by the dotted arrow in FIG. 13 the washer 264 interrupts the beam indicating an error condition which then signals the drive system to stop.

Figure 15:
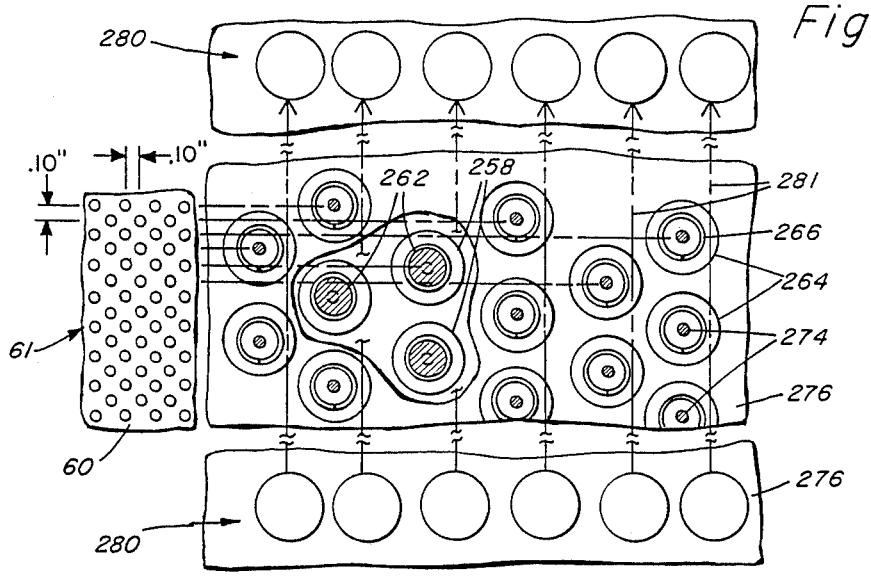
FIG. 15 is a cross-sectional top plan view of the upper moving beam partially cut away to illustrate further details as taken along line 15—15 of FIG. 11.

FIG. 15 is a cross-sectional view taken along line 15—15 of FIG. 11 showing the configuration of the electric eyes 280 and also showing the staggered arrangement of the solenoids and associated injector rods. There are six rows of solenoids per beam and each beam carries 251 solenoids. When an injector rod pops out in a row then the control of the system operates to activate each solenoid selectively in the particular row one by one until the blocking of the injector rod is discovered. Thereafter, the X-Y probe plate drive attempts to find the hole by going in a larger circle until it is found. When that occurs then the particular storage pattern for the hole changes to essentially correct for this error. If the hole cannot be found then it is necessary to provide a new drilling.

FIG. 15 also illustrates the configuration that is used for there to be a solenoid aligned with each column of holes in the base plate matrix 61. Also illustrated in FIG. 15 is the manner in which the electric eyes actually do not interfere with the injector rod themselves but the sensing of the electric eye beam can only be interrupted by the fiber washer 264 being in the position illustrated in dotted outline in FIG. 13.

As indicated previously, the injector rods 260 include thin probe ends 270 and thin free ends 274. As noted in FIG. 11 the injector probe ends 270 are guided precisely by a pair of upper guide plates 294 that are spaced from each other as illustrated in FIG. 11. There is also associated with the lower beams 254 and 256 lower guide plates 296. The upper guide plates 294 are supported by a guide beam 290. Similarly, the lower guide plates 296 are supported by a guide beam 292. The guide beams 290 and 292 are clamped to the rods 146. In this regard refer to FIG. 7 which shows the upper guide beam 290 and the lower guide beam 292 along with the upper guide plates 294 and lower guide plates 296. The lower plates 296 pass up through the clearance hole 155 in the table top 154 as noted in FIG. 11.

As indicated previously, the differential drive 300 is adapted to operate the upper moving beam drive rod 302 and the lower moving beam drive rod 304 as indicated in FIG. 7. It is noted that each of the rods 302 and 304 had respective rack portions 306 and 308 as illustrated in FIG. 7. FIG. 7 also illustrates the pinion gear 310. It is furthermore noted that FIG. 9 illustrates further details of the differential drive 300. There is illustrated the pair of spaced pinion gears 310 each supported on separate shafts 312.

Thus, the differential drive 300 employs a rack and pinion means to move the injector rods 260 into a grabbing position on the probes 100. As illustrated in FIG. 7, the upper moving beam drive rods 302 are pinned to the upper moving beam 252 and passed through clearance holes in the lower moving beam 256 and lower stationary beam 254. The upper moving beam drive rods 32 are slidably held in a bearing mounted in the differential beam 319 shown in FIG. 7. In this regard, also refer to FIG. 9 which illustrates the differential beam 319.

In connection with the differential drive 300, the rack portions 306 and 308 mesh with the pinion gear 310. The lower moving beam drive rods 304 are pinned to the lower moving beam 256 and pass through clearance holes in the lower stationary beam 254. The drive rods 304 are slidably mounted in bearings in the differential beam 319.

The pinion gear 310 is driven by shafts 312 mounted in bearing blocks 314 connected to motor 318 by differentials 314 and the double right angle drive unit 315. In this regard refer to FIGS. 9 and 10. The right angle drive unit 315 and motor 318 are supported in motor bracket 316 which is mounted to the differential beam 319. Rotation of the pinion gear 310 moves the upper moving beam 252 down and the lower moving beam up by an amount of 0.4" each.

The differential beam 319 is itself slidably mounted on the Thompson rods 146 and is moved up and down by the harmonic drive means 320 such as illustrated in FIGS. 7 and 9. The harmonic drive means 320 comprises cams 322 spacedly disposed as illustrated in FIG. 9 and that are adapted to operate through push rods 324 connected to brackets 326. The rotary action of the cams 322 coupled by way of the rods 324 move the differential beam 319 up and down by a preferred amount of 2.7". The movement of the differential beam 319 is cushioned and balanced by air cylinders 328 also illustrated in FIGS. 7 and 9.

The cams 332 are mounted on shafts 330 which are in turn supported in bearing blocks 332. The shafts 330 illustrated in FIG. 9 are connected to the stepper motor 334. Mounted on one of the shafts 330, as viewed in FIGS. 9 and 10 is a toothed pulley 336 connected to a second pulley 340 by a toothed belt 338. This arrangement drives the encoder 342. The encoder 342 detects the position of the moving beams and thus the probes and also enables and disables the electric eyes.

Reference is now made to FIGS. 15A-15G which schematically illustrate a sequence of operation with respect to the manner in which the injector rods operate to transfer probes. In FIGS. 15A-15G, there are illustrated the six rows referred to previously in FIG. 15 and identified as rows A, B, C, D, and F. These correspond to the rows of injector rods which each have an associated solenoid. The solid dots in each row are representative of the staggered arrangement of the solenoid and associated injector rod. The illustration in FIGS. 15A-15G represents a staggered pattern of solenoids. The first staggered row is taken from solenoids B, D, and F and then the following staggered row is of solenoids A, C, and E. The pattern is repeated throughout FIGS. 5A-5G, but it is noted that the matrix moves in the direction of the arrow indicated in a sequence from FIG. 15A through FIG. 15G.

In FIG. 15A is illustrated the start in which the matrix has progressed to its second row in which one of the injector rods in row A is activated. In the illustration described in FIGS. 15A-15G, for the sake of simplicity, it is assumed that all injector rods are being selected in an actual application only certain injector rods would, however, be selected. Also, in the drawing, a selected injector/solenoid is represented by an X in the matrix circle.

FIG. 15B shows a single step of 0.20" illustrating the previously selected injector rod from row A as an X in the matrix circle. It is noted in FIG. 15B that none of the matrix holes have reached the row B solenoid/injector rod. However, the row A injector rod/solenoid is again activated, assuming that it has been selected.

FIG. 15C shows a second step in which the row B solenoid is now activated. The row A solenoid continues to be activated assuming that that particular horizontal row is to have all locations selected.

FIG. 15D illustrates a subsequent or fifth step in which the row C of the solenoid is now engaged. It is noted that the row A and B solenoids continue to be activated also.

FIG. 15E illustrates an eight step in which the row D solenoids are engaged. FIG. 15F illustrates an eleventh step in which the row E solenoids are engaged. Finally, FIG. 15G illustrates a thirteenth step in which the row F solenoids are engaged.

In FIGS. 15A-15G, only six total solenoids are illustrated. However, it is understood that there is a bank of 251 solenoids all repeated in the pattern illustrated by the six solenoids.

Figure 16:
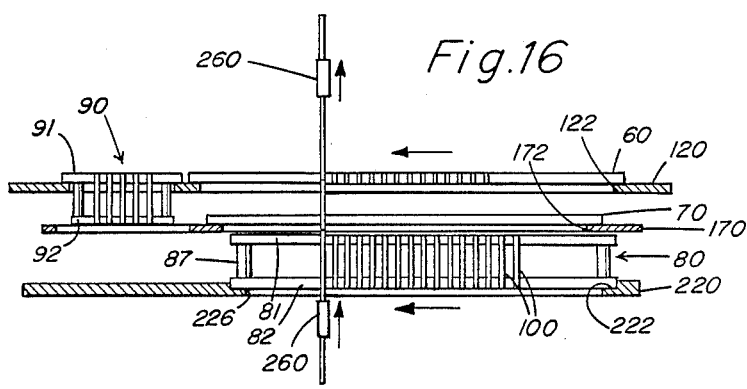
FIG. 16 is a side elevation view illustrating the operation and position of the tables in connection with probe transfer fro the magazine to the probe and base plates.

Reference is now made to FIGS. 16-20 which show various operations that illustrate movement of the base plate and probe plate tables as well as the injection rod and probe operation. FIG. 16 illustrates the base plate 60 disposed on the base plate table 120 and also the probe plate 70 disposed on the probe plate table 170. The base plate 60 and probe plate 70 are to be loaded with probes 100 contained within the primary magazine 80. The primary magazine 80 is considered as being comprised of top plate 81 and bottom plate 82 separated by standoffs 87. The first row of holes in the probe plate is aligned with a first row of probes in the magazine 80 by respective operation of the base plate table drive means and magazine table drive means. Selected injector rods such as the one illustrated in FIG. 16 move probes into the test head. The X-Y probe plate drive means aligns any non-matrix holes throughout the selection process. Both the magazine table and the base plate table move forwardly 0.1" in increments until the test head is full.

In FIG. 16 it is noted that the injector rods 260 it is assumed have already grasped one of the probes 100. The injector rods 260 are then moved in the direction of the arrows that are indicated to move the selected probe 100 out of the magazine 80 and into the test head between the probe plate 70 and the base plate 60.

In connection with the schematic representation of FIG. 16, reference is also made to FIG. 2A and also to FIG. 6. In FIG. 6, in particular, it is noted that there is described therein, a non-standard or random matrix 71. When using a non-standard matrix in association with the base plate, the probe plate is then to be moved in the X and Y coordinates illustrated in FIG. 6. The system of the present invention has the capability of carrying out this X and Y coordinate translation of the probe plate table 170 essentially on a per injector rod basis.

Assuming that the probe plate pattern is random, as illustrated in FIG. 6, then the assembly program operates so that for a particular Y position of the magazine and base plate, the probe plate 70 is controlled by movement of the associated probe plate table 170 in X and Y coordinate direction so as to align, in vertical alignment, holes in the base plate, probe plate, and magazine. This is carried out on a per injector rod, or per probe basis. Thus, in a particular row of injector rods where certain ones are to be selected, with regard to the selected ones, the program operates so as to carry out the necessary X-Y translation for alignment followed by actuation of the solenoid and related injector rod. This transfers a single probe in a particular row. The program continues by then carrying out a subsequent X-Y translation of the probe plate followed by a subsequent actuation of the injector rods to transfer the next probe. This continues for the entire row relative to all selected injector rods.

In the instance wherein some of the holes may follow a standard matrix and others may not, then the control may operate on the basis of first concurrently actuating all injector rods on the standard matrix followed by a sequential operation in which X-Y translations of the probe plate are followed by injections. When the holes fall on the standard matrix, then X-Y translation of the probe plate is not necessary.

Figure 17:
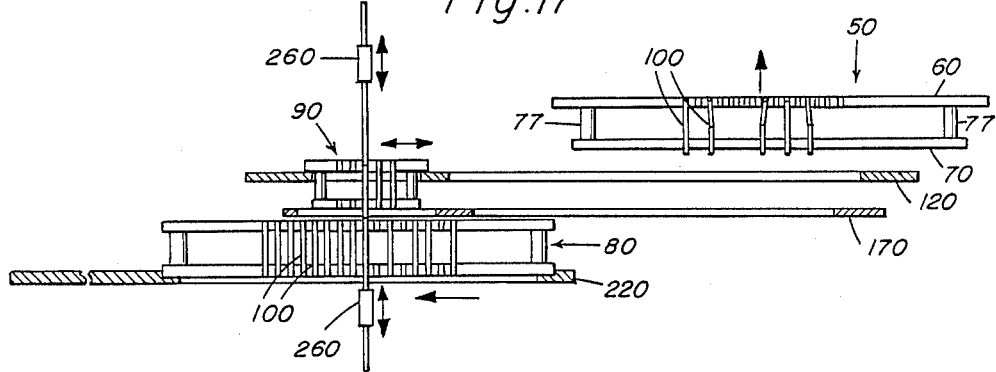
FIG. 17 is a side elevation view of the tables illustrating probe transfer between the primary and secondary magazines.

In FIG. 17 the test head 50 is considered as being full. The tables are then returned to their forward position and the standoffs 77 are locked in position. The test head is then removed with all of the probes 100 in their proper position. On the computer operation, then the system restocks the primary magazine at its rear portion by shuffling probes forward and adding probes from the secondary magazine. The shuffling of probes is accomplished by transferring probes from the primary magazine to the secondary magazine and back again to the primary magazine.

In FIG. 17 the secondary magazine 90 is shown in an overlying position relative to the primary magazine 80. The table 120 may be moved in an X-Y direction to align the probes in the secondary magazine with vacant locations in the primary magazine. The injector rods 260 may then be operated to transfer probes from the secondary magazine 90 to the primary magazine 80.

Figure 18:
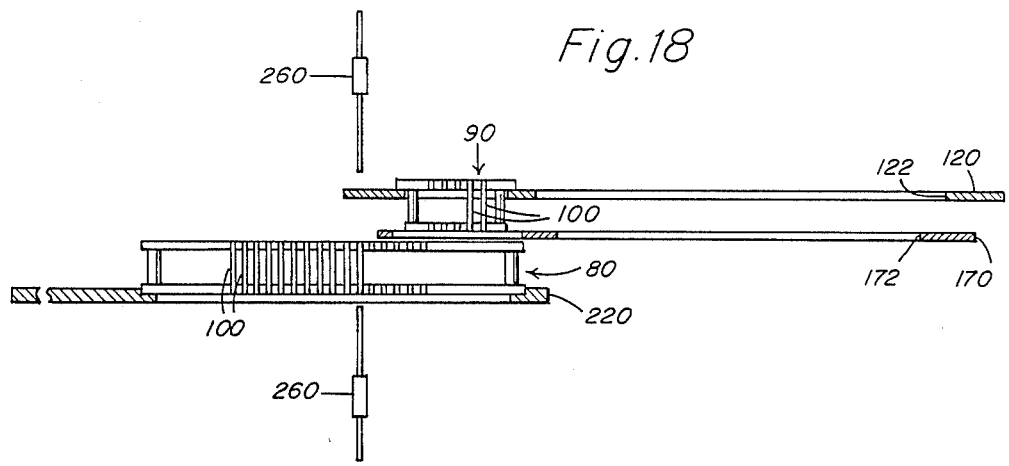
FIG. 18 is a further side elevation view of the tables illustrating a re-stocking step in which probes may be transferred from the secondary magazine to fill the primary magazine.

In FIG. 18 there is illustrated one of the steps in which the restocking of the primary magazine has been completed. The base plate table then moves forward for receiving a new test head for unloading or loading thereof. It is noted in FIG. 18 that the injector rods 260 are withdrawn to set the system up for subsequent assembly of the next test head.

Figure 19:
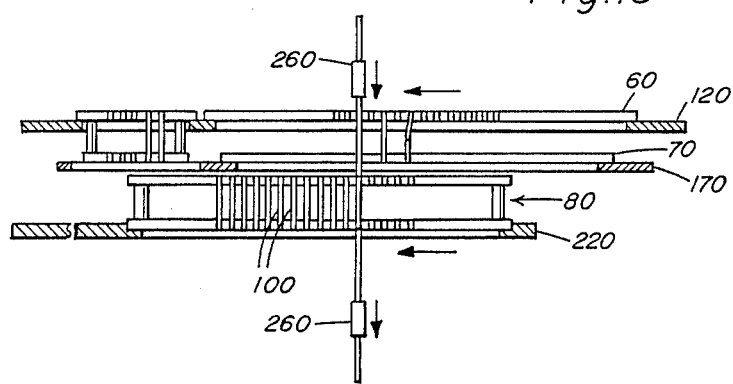
FIG. 19 is a further side elevation view of the tables illustrating, transfer of probes from the test head back to the primary magazine.

FIG. 19 illustrates a step in which probes may be loaded from the test head back into the magazine 80. In this instance the standoffs 77 associated with the test head are unlocked to allow X-Y movement of the probe plate 70. The computer aligns the first row of probes to be dumped with the first row of empty holes in the magazine 80. The magazine and base plate move forwardly 0.1" at a time as the injectors 260 transfer probes. FIG. 19 illustrates schematically one of the probes being transferred from the test head to the magazine 80. In this connection note the injector rods grasp the probe and move the probe downwardly in the direction of the arrows. The tables also move in the direction of the arrows illustrated in FIG. 19 as indicated previously at a 0.1" increment.

Figure 20:
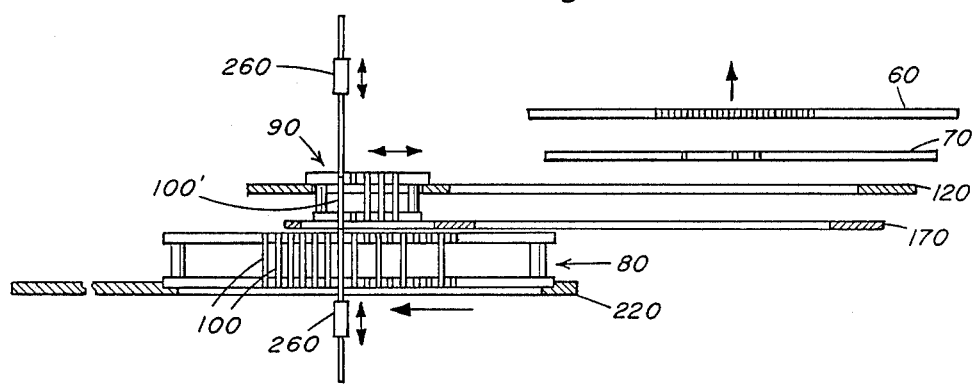
FIG. 20 is a side elevation view of the tables illustrating a sequence in which, under computer control, probes may be removed and replaced.

FIG. 20 illustrates all of the probes having been withdrawn from the test head. Note that no probes are present between the base plate 60 and the probe plate 70. In other words the test head is empty. The test head is then removed. Under computer control the injector rods 260 may operate to transfer probes from the magazine 80 into the secondary magazine 90. For example, if there is a faulty probe that is detected the probe is transferred from magazine 80 to magazine 90 where they may be then removed and replaced.

Reference is now made to FIGS. 21–30 which show operational schematics that illustrate the operating sequences in connection with the operation of the injector rods 260, the solenoids 258, the differential drive 300 and the harmonic drive 320. In FIGS. 21–30 it is noted that adjacent each of the solenoids 258 is a dot legend in which the solid dot represents an "on" condition of the solenoid and a non-solid dot represents an "off" condition of the solenoid. By way of example in FIG. 21 the upper two solenoids associated with upper stationary beam 250 are indicated in an "on" condition while the two lower solenoids 258 associated with the upper moving beam 252 are indicated in an "off" condition.

Reference is now made too FIG. 21 which illustrates the injector rod operation. FIG. 21 shows the mechanism in a position similar to that previously illustrated in FIG. 7. The harmonic drive 320 and in particular the harmonic drive cam 322 is at its bottom dead center position which may be considered the "at rest" position. The injector rods 260 in the diagram of FIG. 21 are in their retracted position relative to the base plate 60, probe plate 70, and magazine 80. In FIG. 21 note the probes 100 mounted in a magazine 80 and furthermore note the absence of any probes between the plates 60 and 70. Also note in FIG. 21 the base receptacles 62 associated with the base plate 60.

The injector rods 260 are held in the solenoids 258 in the stationary beams 250 and 254. Again, this is indicated in FIG. 21 by the solid dots adjacent to the solenoids associated with stationary beams 250 and 254. It is also noted that in this position of the injector rods, they are considered as being in their withdrawn position with the ends thereof supported in guide plates 294 and 296. The tips of the injector rods are substantially coplanar with the outer surface of the plates 294 and 296 as clearly indicated in FIG. 21.

Reference is now made to FIG. 22 which shows the next sequence of operation. In FIG. 22 the cam 322 associated with the harmonic drive 320 is shown at its top dead center position. FIG. 22 also shows the direction of rotation of the cam 322 which is in a clockwise direction. This operation causes the differential beam 319 to move upwardly in the direction of the arrow disposed adjacent to the beam 319. This action also causes the upper moving beam drive rod 302 as well as the lower moving beam drive rod 304 to move upwardly also in the direction of the arrows indicated. This thus causes the moving beams 252 and 256 to also move upwardly in the direction of the arrows as indicated in FIG. 22. The upper moving beam 252 picks up the selected injector rods such as the rod 260 which is the right most rod viewed in FIG. 22. In this connection note that the solenoid 258 associated therewith in the beam 252 is turned on while the solenoid thereabove in the beam 250 is turned off. The injector rod 260 is thus grasped by the solenoid 258 associated with the beam 252. With regard to the other injector rod 260 to the left in FIG. 22 this is maintained held by the stationary beam 250. In this connection it is noted that the solenoid 258 associate with beam 250 is turned on while the solenoid 258 associated with the beam 252 is turned off. Also note in FIG. 22 the slight shift of the injector rod 260 which is disposed slightly in a lower position for the selected injector rod.

It is also noted that with regard to the lower moving and stationary beams, the solenoids 258 associated with the stationary beam 254 are maintained on and thus the injector rods are held essentially in the stationary beam 254. The solenoids 258 associated with the moving beam 258 are turned off and thus the injector rods are not affected thereby. In FIG. 22 it is noted that the probes 100 are still maintained in the magazine 80. The receptacles 62 in the base plate 60 are in line with the injector rods 260 as noted. The X-Y probe plate table may shift the probe plate 70 such as illustrated by the arrow associated with the plate 70 in FIG. 22. This shifts the probe plate 70 into proper alignment with the base plate and magazine in the instance in which the probe plate is drilled in a non-standard matrix. In FIG. 22 it is noted that the particular hole in the probe plate 70 has now been brought into line with the probe 100 therebelow and the injector rod 260 positioned thereabove.

Reference is now made to FIG. 23 which illustrates the harmonic drive 320, and in particular the cam 322 thereof having moved clockwise further to a bottom dead center position. This carries the upper and lower moving beam drive rods 302 and 304 downwardly as indicated by the arrows associated therewith. This in turn causes the moving beams 252 and 256 also to move downwardly in the direction of the arrows as indicated. When the beam 252 moves downwardly it carries with it one of the injector rods 260 which is the right most of the two rods illustrated in FIG. 23. Note the arrow associated with this rod indicating its downward movement. In its downward movement it passes through the base plate 60 and the receptacle 62 mounted therein and also passes through the hole in the probe plate 70. The injector rod 260 moves down to within 0.4" of the top of the probe 100 in the magazine. With regard to the lower moving beam 256, when this moves downwardly, the injector rods do not move therewith as they have been previously retained in the stationary beam 254. However, once in the downward position of the beam 256, the solenoids associated with the beams 254 and 256 are actuated in a different manner as illustrated by the dot notation in FIG. 23. The left most injector rod is still maintained held by the stationary beam 254 and thus the solenoid 258 associated with the stationary beam is turned on while the solenoid 258 associated with the moving beam 256 is turned off. However, the other solenoids are operated in the inverse manner so that the injector rod 260 associated with the beams 254 and 256, and the right most one, is now held by the moving beam 256 rather than by the stationary beam 254. In this connection the solenoid 258 associated with the stationary beam is turned off and the solenoid 258 associated with the moving beam 256 is turned on so that the moving beam 258 retains the injector rod. Also note in FIG. 23 the slight upward movement of the injector rod due to the transfer from the stationary beam 254 to the moving beam 256.

Reference is now made to FIG. 24 which shows the harmonic drive 320 maintained in the same position as illustrated in FIG. 23. In this way the differential beam 319 is maintained in a stationary position while the differential drive 300 comes into play. The cam 322 of the harmonic drive 320 is maintained in its bottom dead center position.

The differential drive now comes into play to move the moving beams 252 and 256 in the direction of the arrows indicated in FIG. 24 by a small amount so as to grab the probe 100. In this connection it is noted that the pinion gear 310 is driven in the direction of the arrow indicated in FIG. 24 which is in a clockwise direction causing the lower moving beam drive rod 304 to move upwardly in the direction of the arrow while at the same time the upper moving beam drive rod 302 moves downwardly as indicated by the direction of the arrow in FIG. 24.

The injector rods 260 which are like matching rods one on either side of the probe 100 as illustrated, having now been picked up by both moving beams 252 and 256 move into contact with the probe 100. The differential drive is operated when the pinion gear 310 moves the rods toward each other in an amount of approximately 0.4" each so that the respective injector rods cradle therebetween the upper and lower ends of the probes 100. In this regard, as indicated previously in FIG. 12 each of the injector rods has a recessed end 272 for retaining each end of the probe 100. In this connection also refer to FIG. 26.

Reference is now made to FIG. 25 which shows the next step in the sequence. In FIG. 25 the harmonic drive 320 comes back into play while there is no action by the differential drive. FIG. 25 shows the continued clockwise rotation of the harmonic drive cam 322 from its bottom dead center position toward a top dead center position. This causes the upper and lower moving beam drive rods 302 and 304 to move upwardly as indicated. This in turn causes the moving beams 252 and 256 to move upwardly in the direction of the arrow. Both of the injector rods 280 having been retained by the moving beams 252 and 256 are thus moved in unison upwardly transferring the probe 100 out of the magazine 80. In FIG. 25 the probe 100 is shown just transferred out of the magazine extending through the probe plate 70 and just contacting the base receptacle 62 in the base plate 60.

With regard to the position of the probe 100 in FIG. 25, reference is now made to FIG. 26 which is an enlarged view of the probe 100 cradled by the injector rods 260. In FIG. 26 there is shown the thin rod probe end 270 of each of the respective injector rods 260. Arrows associated with the ends 270 indicate the upward progression of the probe 100 which has now passed through the probe plate 70 and is in position with the ball end 112 of the probe just below the base receptacle 62.

With regard to the probe 100, it is noted that it is comprised of a telescoping head 101 supported from the hollow tube 103 adjacent the reduced neck 102. The head 101 is shaped as indicated in FIG. 30 and is adapted to fit within the recess 272 in the probe end 270.

The probe 100 illustrated in FIG. 26 also includes a main stem 109 that supports at its top end the ball 112 adjacent the reduced neck 111. At the bottom of the stem 109 there is also a reduced neck 110 that supports the ball 108 for providing a midway pivot in the probe the function of which will be discussed in further detail hereinafter.

It is also noted in FIG. 26 that the base receptacle 62 provides a clearance bore 63 having at the bottom end thereof a spherical cavity 64 that is provided with a plurality of slits 65 such as illustrated in FIG. 28.

It is furthermore noted in FIG. 26 that although a pivot is provided at a midpoint of the probe, the base plate and probe plate are mounted so that no pivoting action can occur during a probe transfer. The plates 60 and 70 are retained sufficiently close in comparison with the length of the probe so that, for example, in the position of FIG. 26 it is not possible to pivot the probe or fold the probe over as it is being transferred.

Reference is now made to FIG. 27 which shows a further sequence of operation. In FIG. 27, it is noted that the harmonic drive cam 322 has progressed almost to a top dead center position. Just before the top dead center position, the differential drive comes into operation. It is noted in FIG. 27 that the differential drive pinion 310 now operates in a counter clockwise direction, whereby the upper moving beam drive rod 302 has upper relative movement relative to the differential beam 319 while the lower moving beam drive rod 304 moves relatively downwardly, as indicated by the arrows. At the same time, the beam 319 is moving upwardly as indicated by the arrows associated with the moving beams 252 and 256. The operation of the differential drive pinion gear 310 and associated rods 302 and 304 causes an opening between the injector rods. In this connection, note the more detailed cross-sectional view of FIG. 28. The opening of the injector rods occurs at the time that the ball 112 of the probe is about to seat in contact with the spherical cavity 64 in the base receptacle 62. In FIG. 28, also note that the upper injector rod end 270 has now been moved away from the top of the probe. This has been occasioned by the differential drive at the pinion gear 310.

FIG. 27 also shows the solenoid 258 in the beam 252 being turned off. The solenoid in the beam 250 thereabove is also off and thus the injector rod is essentially free-floating without any force being applied by the solenoids. As indicated previously, the relative movement of the beams 252 and 256 is still upwardly, and thus although there has been a spreading between the injector rods, the lower injector rod as indicated in FIG. 28 is still moving upwardly so as to propel the probe 100 at its end 112 into the spherical cavity 64 into the base receptacle.

As indicated previously in connection with FIG. 28, it is noted that the probe 100 is illustrated at a position in which the ball end 112 is just about fitting within the spherical cavity 64. The slots 65 allow the ball 112 to slip past the neck 111 and into the spherical receptacle 64. In the preferred embodiment of the invention, the clearance bore 63 is 0.069" and the probe diameter is 0.071".

FIG. 29 illustrates the harmonic drive in a position in which the cam 322 is at its top dead center position. This means that the differential beam 319 is also at its uppermost position. At the same time, the differential drive as controlled by the pinion gear 310, goes to its full open position by counter-clockwise rotation of the pinion gear 310. The probe 100 is now in position such as illustrated in dotted outline in FIG. 30. In such a position, the ball 112 of the probe sits within the spherical cavity 64 in the base receptacle 62. The head 101 of the probe extends below the probe plate 70 in the manner illustrated in FIG. 30.

It is noted in FIG. 29 that the solenoids 258 associated with the moving beam 252 are now de-energized while the solenoids 258 associated with the stationary beam 250 area energized. This action causes the injector rod 260 to now be held in its uppermost position retained by the stationary beam 250. In FIG. 29, the operable injector rod has been illustrated with the associated solenoid 258 in the moving beam 256 energized and the solenoid 258 in the stationary beam 254 de-energized.

As the operation continues, the harmonic drive cam 322 continues rotating in a clockwise direction to a bottom dead center position. The solenoid 258 in the beam 256 is then de-energized and the solenoid 258 in the beam 254 is energized so that the lower injector rod is also disengaged from the magazine 80.

FIG. 30 shows the probe in dotted outline in its normal aligned position. However, when using a non-standard matrix for the probe plate 70, after the probe has been properly inserted between the probe plates 60 and 70, then the X-Y drive for the probe plate will return to a dead center position causing a bending of the probe as illustrated in solid outline in FIG. 30. The machine is then ready for the next cycle. In this connection, refer to FIG. 21 which essentially again shows the beginning of the cycle.

Figure 31:
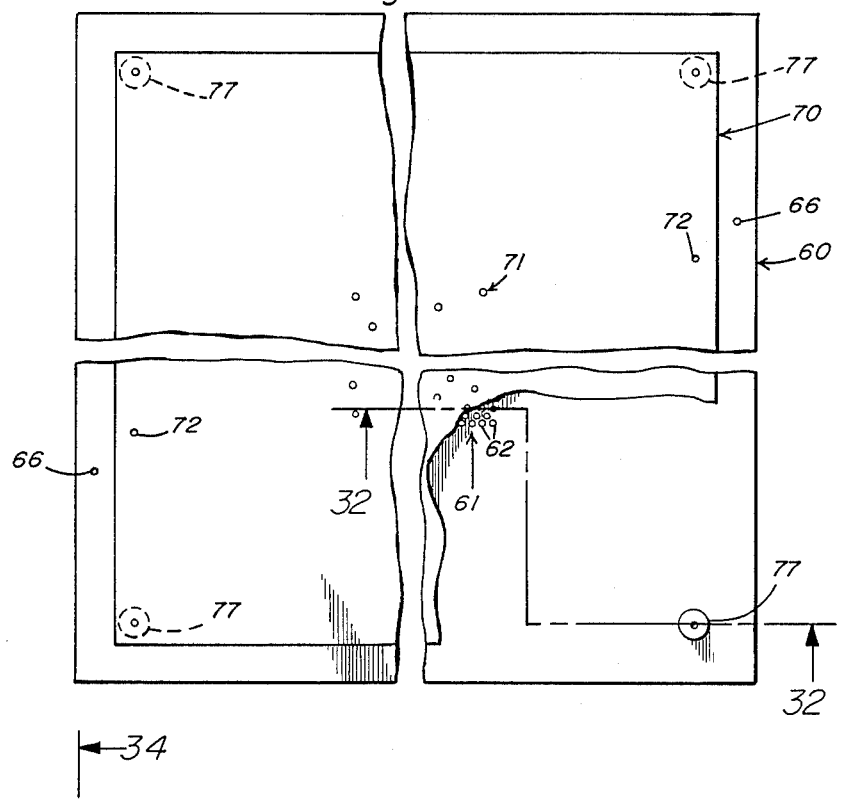
FIG. 31 is a top plan view of the test head with the probe plates partially broken away.
Figure 32:
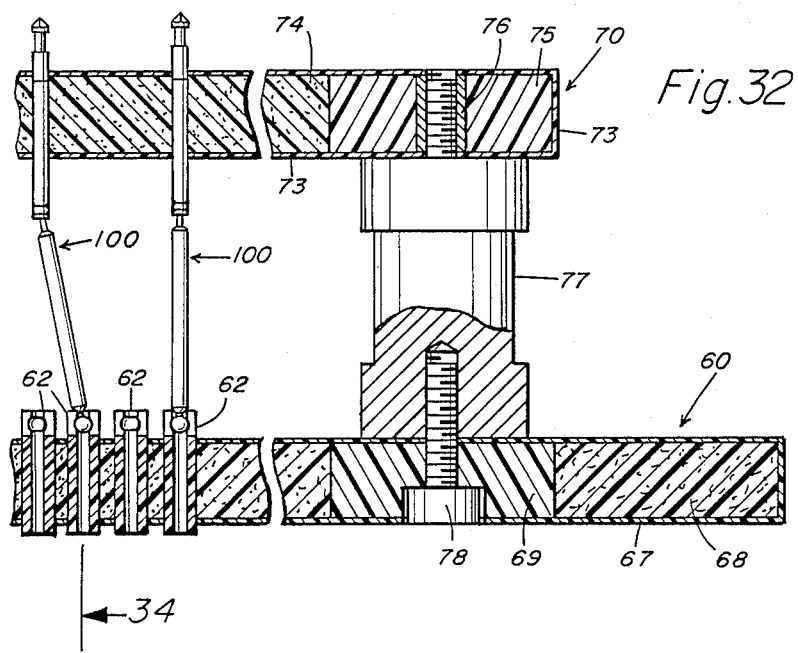
FIG. 32 is a cross-sectional view taken along 32—32 of FIG. 31 showing further details of the test head including the stand-offs for supporting the base head probe plates of the test head.

Reference is now made to FIG. 31 which is a top plan view of a test head as removed after assembly. The test head is comprised of a base plate 60 and a probe plate 70 which are adapted to be locked together with stand-offs 77. In this connection, also refer to the cross-sectional view of FIG. 32 which is also taken along line 32—32 of FIG. 31. In FIG. 32 it is noted that the base and probe plates are shown inverted from the position of FIG. 29. The position of FIG. 32 is for testing as illustrated in further detail (see FIG. 42) hereinafter.

FIG. 31 shows the matrix 61 associated with the base plate 60 and also illustrates the probe plate 70 and its particular matrix 71. The matrix 71 corresponds to a particular random matrix of test points associated with the printed circuit board that is to be subsequently tested. FIG. 31 also shows the locating holes 66 associated with the base plate 60 and also the locating holes 72 associated with the probe plate 70.

As illustrated in FIG. 32, the base plate comprises a glass skin 67 surrounding a foam core 68. Associated with the stand-offs are phenolic inserts 69.

Similarly, the probe plate 70 has a glass skin 73 which encloses the foam core 74. This is also provided with phenolic inserts 75 as noted in FIG. 32. There is also provided a steel insert 76 that receives one end of the stand-off 77. The stand-off 77 is screwed into the internally threaded steel insert 76. A screw 78 locks the probe plate to the base plate at the stand-off 77. It is important that the plates 60 and 70 be locked together in an integral manner once all the probes have been inserted into the test head.

During the assembly step in which the probes are inserted into the test head, the stand-offs 77 may be left screwed into the probe plate 70. However, the screw 78 is not affixed and thus the probe plate 70 is free to slide in the X-Y directions during assembly.

Reference is now made to FIG. 33 which shows a conventional probe in which the probe offset has a maximum of approximately 0.07". In this connection, also refer to FIG. 34 which shows the articulated probe of the present invention providing a maximum offset of 0.20". In FIG. 34, the probe is shown in a bent position with the ball end 112 retained in the base retainer 62. The pivot ball 108 is retained in the hollow tube 103 by virtue of the roll crimps 105 and 106. The telescoping head 101 is illustrated as having a reduced neck portion forming a shoulder retained by the roll crimp 104. Inside of the hollow tube 103 is disposed the spring 106. The telescoping head 101 of the probe is urged against the bias of the spring 106 for providing biasing force of the probe against a printed circuit board. FIG. 34 also shows the contact of the head 101 against the printed circuit board 417 along with the electrical contact to the tester for applying signals to the circuit board.

Figure 35:
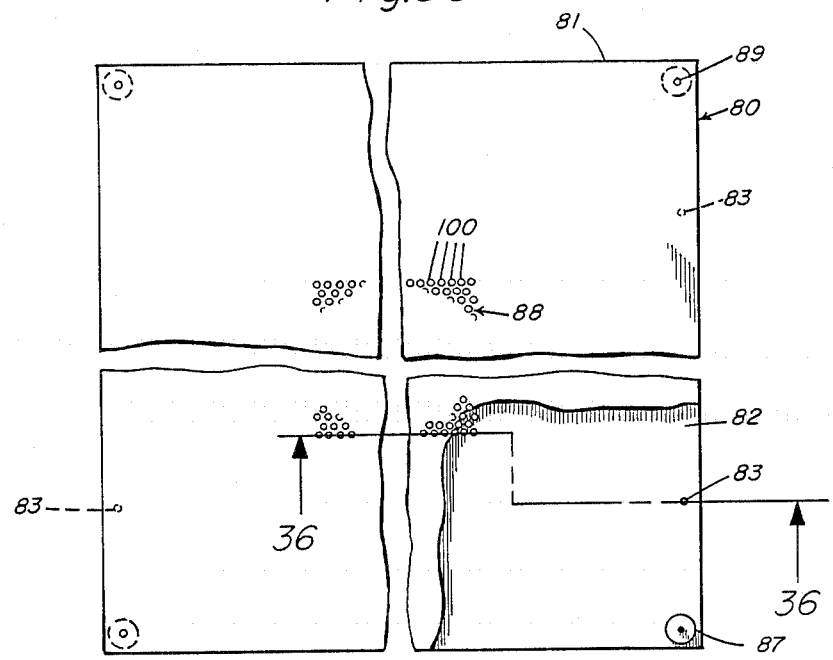
FIG. 35 is a top plan view of the primary magazine illustrated in the apparatus.
Figure 36:
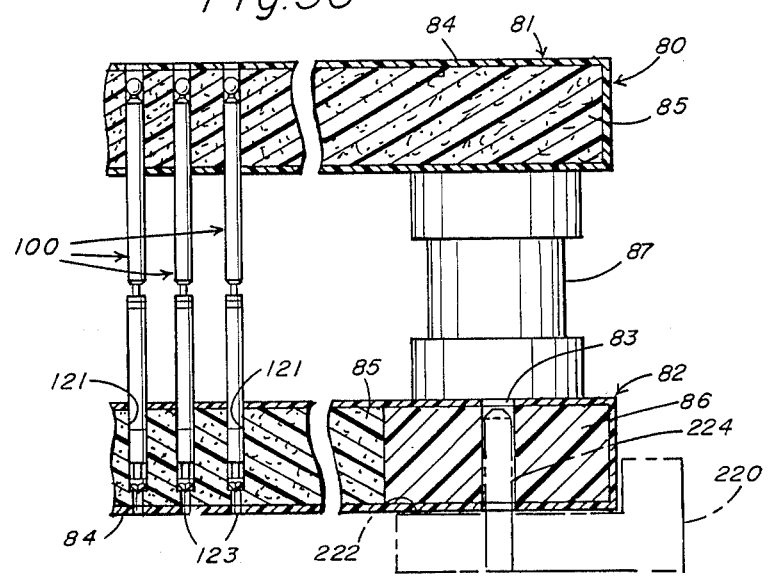
FIG. 36 is a cross-sectional view taken along line 36—36 of FIG. 35 showing further details of the magazine furthermore illustrating probes mounted therein.

FIG. 35 is a top plan view of the magazine 80. FIG. 36 is a cross-sectional view taken along line 36—36 of FIG. 35 showing further details.

The magazine 80 is comprised of a pair of plates including a top plate 81 and a bottom plate 82. As illustrated in FIG. 35, there is associated with the magazine locating holes 83. In this regard, also note the locating pins 224 associated with the recessed seat 222 of the magazine table 220. The aforementioned locating holes 83 are disposed in phenolic inserts 86. Each of the top and bottom plates includes a glass skin 84 enclosing a foam core 85. The bottom plate 82 as illustrated in FIG. 36 has holes for receiving the probes. It is noted that each of the probe holes is stepped providing a reduced diameter section for holding the probe and preventing the probe from slipping out of the magazine. At the top plate 81, the hole is sized so as to readily receive the probe in the position illustrated in FIG. 36. With regard to the magazine 80, it is also noted that it is provided with stand-offs 87 for retaining the top and bottom plates together. These stand-offs may have associated therewith screws 87 for holding the plates in position. FIG. 36 also shows the aforementioned reduced diameter bore including a larger section bore 121 in plate 82 and a reduced diameter bore 123. The bore 121 may be 0.071" while the bore 123 may be 0.069".

Reference is now made to FIG. 37 which is a top plan view of the secondary magazine 90 showing further details thereof. FIG. 38 is a cross-sectional view taken along line 38—38 of FIG. 37. Just like the primary magazine, the secondary magazine includes a top plate 91 and a bottom plate 92. These plates may be of the same construction as illustrated in connection with the primary magazine. FIG. 38 shows the secondary magazine locating pins 128 that are adapted to be received by the top plate 91. Stand-offs 96 are provided for securing the plates 91 and 92 together. FIG. 37 also shows special purpose probes 98 that may be held at one end in the base receptacle 93. With regard to the locating pins 128, it is noted that they are supported from the base plate table 120 with the bottom plate 92 of the secondary magazine extending downwardly through the secondary magazine clearance hole 126.

Reference is now made to FIGS. 39-42 that illustrate the details of the testing system. This is where the testing of the printed circuit board occurs. This takes place after the test head assembly has been completed at the assembly station.

Figure 41:
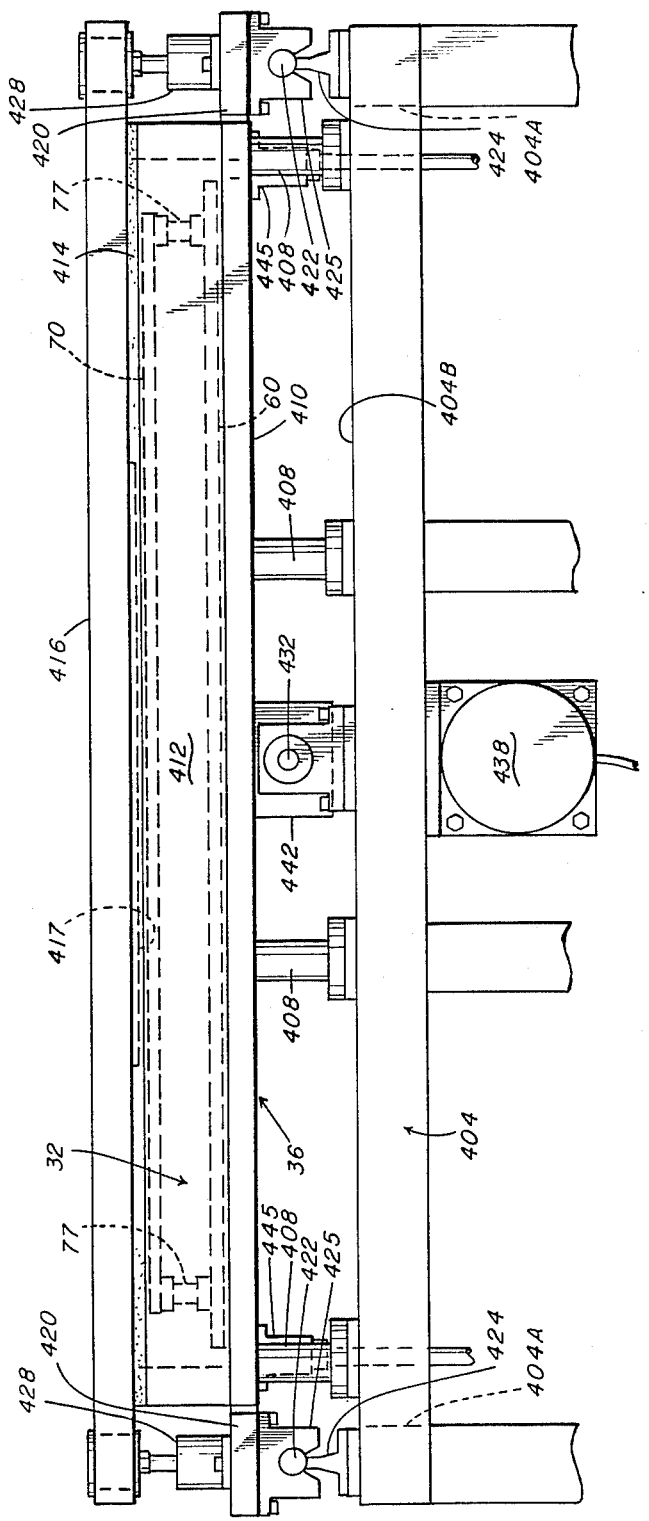
FIG. 41 is a cross-sectional view taken along line 41—41 of FIG. 40 showing further details.
Figure 42:
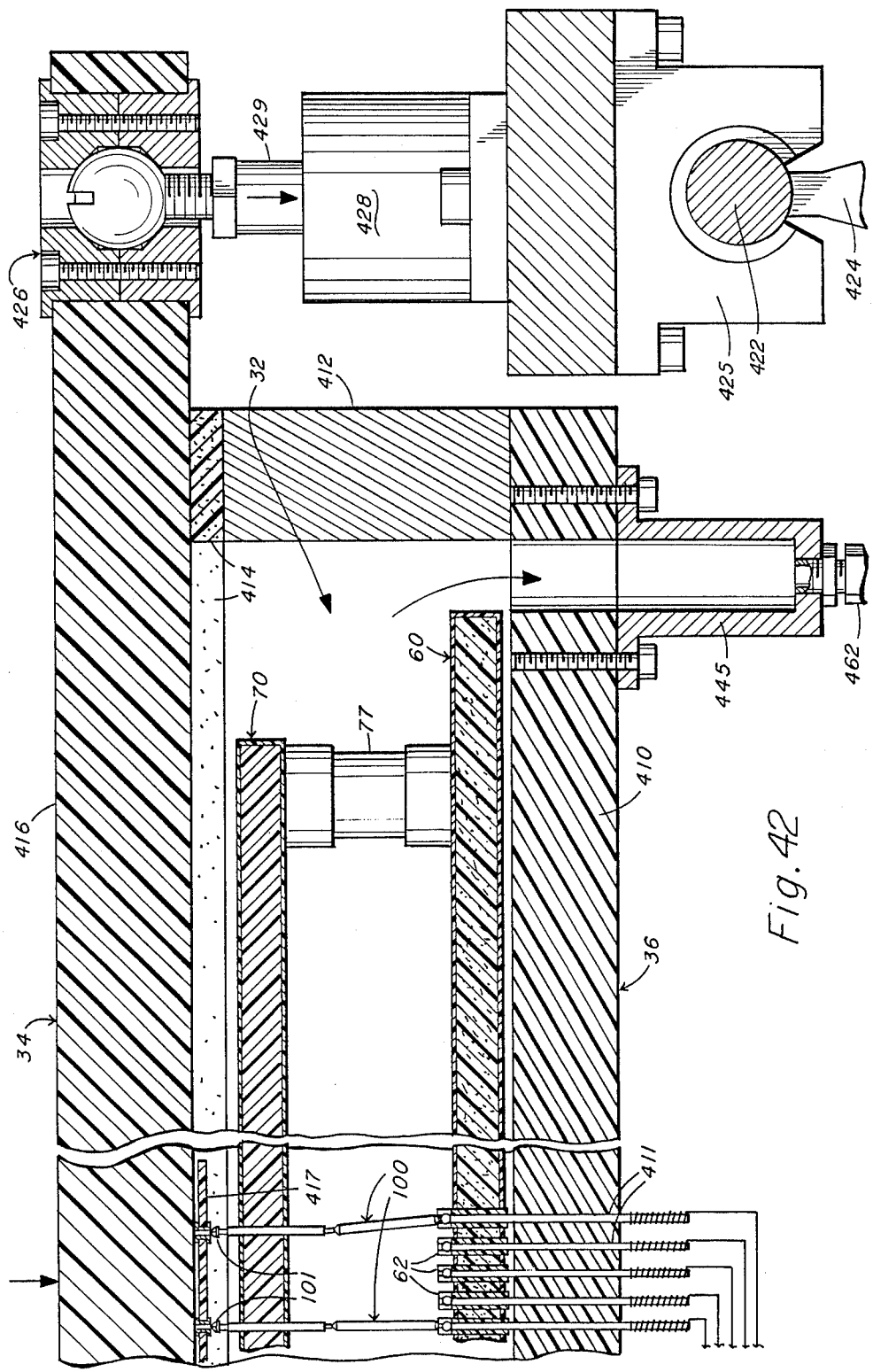
FIG. 42 is a further cross-sectional view taken along line 42—42 of FIG. 40.

With regard to the details of the testing station, FIG. 39 is a side elevation view. FIG. 40 is a top plan view of the apparatus. FIGS. 41 and 42 are cross-sectional views taken along lines 41—41 and 42—42, respectively of FIG. 40.

The testing station is comprised of a housing 402. Supported within the housing 402 is a main frame 404 which is comprised of a plurality of longitudinally extending members along with side members and cross members. In this regard, reference is made to FIG. 40 which shows the main frame 404 with the longitudinally extending side members 404A, end members 404B and cross members 404C.

The testing apparatus of testing station is adapted to support in a fixed position, the test head assembly 50 which is supported on the plurality of support posts 408. In this regard, note the support posts 408 illustrated in FIGS. 40 and 41.

With respect to the support for the test head assembly 50, reference is made to FIGS. 41 and 42 which show the assembly 50 disposed on the contact plate 410. It is actually the contact plate 410 that is directly supported on the plurality of support posts 408. A vacuum chamber is provided about the test head assembly by means of the vacuum frame 412 having disposed on the top thereof a vacuum seal 414.

FIG. 39 if the drawings illustrates the plexiglass cover 416 in its retracted position so that it is not overlying the test head assembly. In FIG. 39 it is noted that the plexiglass cover 416 is disposed to the right of the test head assembly. The cover 416 (pressure plate) is supported from a movable, substantially square frame 420 which is supported on the sides from longitudinally extending rails 422 such as illustrated in FIG. 41. These rails are in turn supported from a plurality of rail supports 424 that are in turn fixed to a top surface of the main frame, and in particular, the main frame side members 404A.

Illustrated in FIGS. 39 and 40 are the means of support of the plexiglass cover from the frame 420. This is by means of four air cylinders 428. Further details of the cover 416 support described hereinafter in connection with FIG. 42.

FIGS. 39 and 40 also shows the drive pulley 430 which in turn drives the drive shaft 432 for providing drive to the frame 420. Further details of the drive for the frame 420 are illustrated in FIG. 41.

FIG. 39 illustrates the testing apparatus or test station in a longitudinal side elevation view illustrating the vacuum frame 412 in which the test head assembly is disposed. The vacuum frame, as previously indicated, is supported from the contact plate 410. The cover or pressure plate 416 is shown to the right so that access is provided for disposing the test head assembly. A segment of the linear drive shaft 432 is illustrated supported from the support member 436. Member 436 is in turn affixed to one of the cross-pieces 404C of the main frame 404. FIG. 11 also illustrates the drive pulley 430 which is driven from the drive motor 438. The motor 438 has an output pulley 430 that drives the pulley 430 via the belt 440. The motor 438 may be supported from the same support member 436 as the linear drive shaft 432 is supported from.

FIG. 39 also shows the linear follower 442 which moves the frame 420 in a linear path from the linear drive shaft. The linear follower is of a type that will automatically slip should the frame contact anything during its transition. This is a safety feature so that should an operator insert his hand, even though the drive motor 438 is operating to drive the frame 420, the linear follower 442 provides slippage so that no damage occurs.

Reference is now made to FIG. 41 which is a cross-sectional view taken along line 41—41 of FIG. 40 now illustrating the pressure plate or cover 416 in an overlying position relative to the test head assembly 406. FIG. 41 also illustrates the PC board 417 in its position between the plate 416 and the test head assembly. The square shaped frame 420 is illustrated, having supported thereon on its top side, the air cylinder 428 which in turn supports the pressure plate 416. The support under the frame 420 is the slide 425 which engages with the rail 422. It is noted that FIG. 41 also illustrates the contact plate 410 showing the wire wrapped connections associated therewith at 411.

Reference is now made to FIG. 42 which is a further cross-sectional view taken along line 42—42 of FIG. 40 in particular showing further details of the support for the pressure plate 416 and also illustrating further details of the vacuum chamber and test head assembly 50. The frame 420 is illustrated as supporting the air cylinder 428. The air cylinder 428 has an output shaft 429 that engages with the pressure plate 416. In the position illustrated in FIG. 39 of the pressure plate, when it is not overlying the test head assembly, the air cylinder 428 is operated to move the pressure plate 416 to its uppermost position. This may provide a lifting on the order of one-half inch from the position illustrated in FIG. 42. In FIG. 42, the air cylinder 428 is shown in the opposite position in which the shaft 429 moves downwardly so as to compress the pressure plate 416 against the PC board 417. At the same time that this compression occurs, the pressure plate 416 also seals against the vacuum frame 412 by means of the vacuum seal 414.

With regard to a sequence of operation, the air cylinders are operated to seal the vacuum chamber and provide some pressure on the printed circuit board so as to provide contact with the test head assembly. Thereafter, the vacuum is pulled at vacuum ports 445 illustrated in FIG. 42. A vacuum may be pulled up to two tons to insure contact of the probes with both the printed circuit board and the base contact plate 410.

FIG. 42 also shows further detail of the test head assembly 50 which is comprised of a probe plate 70 that is pre-drilled and a base plate 60 which is also pre-drilled and supports a plurality of snap-fit sleeves 62 (base receptacles).

The probe plate 70 and the base plate 60 are maintained in parallel secured relationship to each other by means of the stand-offs 77. There are preferably four of these provided, each at a corner of the test head assembly.

FIG. 42 also illustrates a probe 100 having a contact end 101 that is adapted to contact with a point on the printed circuit board 417. The bottom end of the probe 100 is seated in the base receptacle 662 as illustrated in FIG. 42.

FIG. 42 also illustrates a registration pin 458 that extends between the contact plate 410 and the base plate 60 for maintaining proper registration between the test head assembly and the contact plate. Actually, there are at least two registration pins so that proper two-dimensional registration is maintained.

With regard to the cross-sectional detailed view of FIG. 42, there is illustrated therein, two probes 100, one in a linear arrangement, and the other shown slightly at an angle. The head 101 of each probe is illustrated in contact with the circuit board 417 at a conductive circuit run where the circuit board is to be tested. The bottom ends of the probes sit within the base receptacle 62. In FIG. 42, the bottom of the probe at the ball 112 is seated at the very top of the receptacle. There are also provided in the base receiver 410, base contacts 411 which are adapted to slide into the base receptacles for contact with the ball end 112 of the probe. These base contacts are shown having associated therewith, a wire wrapping for connection to the test apparatus. Individual electrical signals may be applied to each of the base contacts for testing the circuit board. The base contacts 411 may be supported with the spring action.

Reference is now made to FIG. 40 illustrating the basic main frame construction with the support posts 408. FIG. 40 also shows the elongated linear drive shaft 432 which has an end support 443 secured to the main frame cross member 404C. The drawing also shows the linear follower 442, assuming that the overlying square-shaped frame is transitioned to the right.

The frame 420 and the linear drive slip follower 442 are illustrated. The member 442 is secured to the underside of one side of the movable frame 420.

In accordance with one element of control of the present invention, it is preferred to provide a system in which the amount of vacuum that is applied to the test head at the vacuum port is a function of the number of probes that are disposed in the test head. With the programming aspects of the system of this invention, the system keeps track of the number of probes that are used in a particular test head. This quantity is then used as a control parameter for controlling the amount of vacuum that is pulled in the vacuum chamber for contact purposes.

Having now described a limited number of embodiments of the present invention, it should now be apparent to those skilled in the art that numerous other embodiments and modifications thereof are contemplated as falling within the scope of the present invention as defined by the appended claims.

What is claimed is:

1. In a circuit board testing system, apparatus for assembling a test head comprising;
   a base plate,
   a base plate table for supporting the base plate, said base plate having a matrix of holes,
   a probe plate,
   a probe plate table for supporting the probe plate adjacent said base plate,
   said probe plate having a matrix of holes,
   a probe magazine, a plurality of probes in the magazine, a magazine table for supporting the magazine adjacent said base plate and probe plate, drive means for Y-drive of said base plate, drive means for Y-drive of said probe plate, drive means for Y-drive of said magazine, said drive means adapted to align holes in the base and probe plate with probes in the magazine, and injector means maintained in a stationary position adjacent said moving base plate, probe plate and magazine contacting a selected probe for transfer thereof from said magazine to a position supported intermediate said base plate and probe plate, said base plate being supported over said probe plate and said magazine being supported under said probe plate.

2. Apparatus as set forth in claim 1 including standoff means for holding the base plate and probe plate in fixed relative position once all probes are inserted to thus form a test head.

3. Apparatus as set forth in claim 1 including drive means for X drive of said probe plate table so that the probe plate may be X and Y positioned relative to the base plate to provide base plate and probe plate hole alignment.

4. Apparatus as set forth in claim 3 wherein the X and Y probe plate positioning relative to the base plate is in a small radius on the order of 0.25".

5. In a circuit board testing system, apparatus for assembling a test head comprising;

a base plate, a base plate table for supporting the base plate, said base plate having a matrix of holes, a probe plate, a probe plate table for supporting the probe plate adjacent said base plate, said probe plate having a matrix of holes, a probe magazine, a plurality of probes in the magazine, a magazine table for supporting the magazine adjacent said base plate and probe plate, drive means for Y-drive of said base plate, drive means for Y-drive of said probe plate, drive means for Y-drive of said magazine, said drive means adapted to align holes in the base and probe plates with probes in the magazine, and injector means maintained in a stationary position adjacent said mdoving base plate, probe plate and magazine contacting a selected probe for transfer thereof from said magazine to a position supported intermediate said base plate and probe plate, said drive means for the magazine being a stepped drive.

6. Apparatus as set forth in claim 5 wherein the magazine steps in increments of 0.1".

7. Apparatus as set forth in claim 5 including a secondary magazine and a plurality of probes in the secondary magazine.

8. In a circuit board testing system, apparatus for assembling a test head comprising;

a base plate, a base plate table for supporting the base plate, said base plate having a matrix of holes, a probe plate, a probe plate table for supporting the probe plate adjacent said base plate, said probe plate having a matrix of holes, a probe magazine, a plurality of probes in the magazine, a magazine table for supporting the magazine adjacent said base plate and probe plate, drive means for Y-drive of said base plate, drive means for Y-drive of said probe plate, drive means for Y-drive of said magazine, said drive means adapted to align holes in the base and pore plates with probes in the magazine, and injector means maintained in a stationary position adjacent said moving base plate, probe plate and magazine contacting a selected probe for transfer thereof from said magazine to a position supported intermediate said base plate and probe plate, a secondary magazine and a plurality of probes in the secondary magazine, said secondary magazine being supported by said base plate table in a position forward of said base plate.

9. Apparatus as set forth in claim 7 wherein said injector means is adapted to transfer probes from said secondary magazine to said primary magazine in vacant locations thereof so as to re-stock said primary magazine.

10. Apparatus as set forth in claim 9 wherein said injector means is adapted to transfer probes between primary and secondary magazines.

11. Apparatus as set forth in claim 1 wherein said injector means includes at least one upper injector rod and means for supporting the injector rod above the base and probe plates, and at least one lower injector rod and means for supporting the injector rod below the base and probe plates.

12. Apparatus as set forth in claim 11 including means for transferring said injector rods toward each other in alignment with each other to grip respective opposite ends of the probe.

13. Apparatus as set forth in claim 12 including means transferring the probe from the magazine, once gripped, to the base and probe plates.

14. Apparatus as set forth in claim 1 wherein said injector means comprises a plurality of injector rods separated into upper and lower injector rod banks, one above the bae and probe plates and the other below the base and probe plates.

15. Apparatus as set forth in claim 14 including means for supporting the upper and lower injector rod banks comprising an upper stationary beam and an upper moving beam disposed between the upper stationary beam and the base plate, and a lower stationary beam and lower moving beam disposed between the lower stationary beam and the base plate.

16. In a circuit board testing system, apparatus for assembling a test head comprising;

a base plate, a base plate table for supporting the base plate, said base plate having a matrix of holes, a probe plate, a probe plate table for supporting the probe plate adjacent said base plate, said probe plate having matrix of holes, a probe magazine, a plurality of probes in the magazine, a magazine table for supporting the magazine adjacent said base plate and probe plate, drive means for Y-drive of said base plate, drive means for Y-drive of said probe plate,
drive means for Y-drive of said magazine,
said drive means adapted to align holes in the base and probe plates with probes in the magazine,
and injector means maintained in a stationary position adjacent said moving base plate,
probe plate and magazine contacting a selected probe for transfer thereof from said magazine to a position supported intermediate said base plate and probe plate,
said injector means comprises a plurality of injector rods separated into upper and lower injector rod banks, one above the base and probe plates and the other below the base and probe plates,
means for supporting the upper and lower injector rod banks comprising an upper stationary beam and an upper moving beam disposed between the upper stationary beam and the base plate, and a lower stationary beam and lower moving beam disposed between the lower stationary beam and the base plate,
each beam having electrical solenoid means selectively actuable to hold the injector rod supported therein.

17. Apparatus as set forth in claim 16 wherein the injector rods are held under solenoid means control in the stationary beams when unselected.

18. Apparatus as set forth in claim 17 wherein the injector rods are held under solenoid means control in the moving beams when selected.

19. Apparatus as set forth in claim 18 including means for controlling motion of the moving beams to enable probe transfer between the test head and probe magazine.

20. Apparatus as set forth in claim 19 wherein said means for controlling beam motion includes a harmonic drive means and a differential drive means.

21. Apparatus as set forth in claim 20 including a differential beam driven from said harmonic drive means.

22. Apparatus as set forth in claim 21 including upper and lower beam drive rods supported from said differential beam.

23. Apparatus as set forth in claim 22 wherein said harmonic drive means includes a rotating cam operating a pushrod that drives the differential beam.

24. Apparatus as set forth in claim 23 wherein said differential drive means includes a rack and pinion means for importing opposite translation of said beam drive rods for providing gripping action of the probe.

25. Apparatus as set forth in claim 1 wherein each probe includes a base end and a head end joined by a pivot so that the probe can be offset between the base plate and probe plate.

26. An automatic testing system for testing printed circuit boards comprising;
a magazine for temporarily storing a plurality of probes therein, a test head adapted to receive selected ones of the probes and position the probes in a pattern matching test points on the printed circuit board,
means supporting the test head adjacent to the magazine and in a position to receive probes from the magazine,
means for transferring selected probes from the magazine to the test head,
said test head comprising a probe plate and a base plate,
and means for X-Y drive control of the probe plate relative to the base plate to align holes in the probe and base plates,
said means for transferring selected ones of the probes comprises injector means maintained in a stationary position adjacent the base plate,
said injector means including at least on injector rod, and a means for supporting the injector rod above the base and probe plates, and at leat one lower injector rod and means for supporting the injector rod below the base and probe plates,
means for transferring said injector rods toward each other in alignment with each other to grip respective opposite ends of the probe,
said injector means comprises a plurality of injector rods separated into upper and lower injector rod banks, one above the base and probe plates and the other below the base and probe plates,
means for supporting the upper and lower injector rod banks comprising an upper stationary beam and an upper moving beam disposed between the upper stationary beam and the base plate, and a lower stationary beam and a lower moving beam disposed between the lower stationary beam and the base plate,
each beam having electrical solenoid means selectively actuable to hold the injector rod supported therein, wherein the injector rods are held under solenoid means control in the stationary beams when unselected and wherein the injector rods are held under solenoid control means in the moving beams when selected.

27. An automatic testing system as set forth in claim 26 including means for controlling motion of the moving beam to enable probe transfer between the test head and probe magazine including a harmonic drive means and a differential drive means along with a differential beam driven from said harmonic drive means.

28. An automatic testing system as set forth in claim 27 including upper and lower beam drive rods supported from said differential beam wherein said harmonic drive means includes a rotating cam operating a push rod that drives the differential beam, said differential drive means including a rack and pinion means for imparting opposite translation of said beam drive rods for providing gripping action of the probe.

29. An automatic testing system a magazine for temporarily storing a plurality of probes therein, a test head adapted to receive selected ones of the probes and position the probes in a pattern matching test points on the printed circuit board,
means supporting the test head adjacent to the magazine and in a position to receive probes from the magazine,
means for transferring probes form the magazine to the test head,
said test head comprising a probe plate and a base plate,
and means for X-Y drive control of the probe plate relative to the base plate to align holes in the probe and base plates,
a testing sub-assembly comprising a base receiver plate having support contacts adapted to conductively couple to probes of the test head at the test head base plate, means defining a vacuum chamber about the test head including in part said base receiver plate, a pressure plate forming a top of the vacuum chamber having the printed circuit board being tested disposed between the pressure plate and probes extending from said probe plate and in contact with test points on the printed circuit board, and means for drawing a vacuum on said vacuum chamber to force intimate contact between the test head, printed circuit board, and base receiver.

30. An automatic testing system as set forth in claim 29 wherein said vacuum chamber is defined also by a peripheral frame having resilient sealing means disposed between the top of the frame and the pressure plate.

31. An automatic testing system as set forth in claim 30 including at least one vacuum port in the base receiver plate.

32. An automatic testing system as set forth in claim 31 including means for supporting the pressure plate for sliding motion over the top of the vacuum chamber.

33. An automatic testing system as set forth in claim 32 including air cylinder means for initially urging the plate into contact with the peripheral frame.

34. An automatic testing system as set forth in claim 33 wherein the vacuum pressure applied is a function of the number of probes in the test head.

* * * * *